(12) United States Patent
Chu et al.

(10) Patent No.: US 7,260,008 B2
(45) Date of Patent: Aug. 21, 2007

(54) ASYNCHRONOUS FIRST-IN-FIRST-OUT CELL

(75) Inventors: Yeh-Lin Chu, Taiping (TW); Wei Hwang, La Verne, CA (US)

(73) Assignee: National Chiao Tung University, Hsinchu (TW)

( * ) Notice: Subject to any disclaimer, the term of this patent is extended or adjusted under 35 U.S.C. 154(b) by 94 days.

(21) Appl. No.: 11/330,159

(22) Filed: Jan. 12, 2006

(65) Prior Publication Data

US 2007/0097771 A1    May 3, 2007

(30) Foreign Application Priority Data

Oct. 28, 2005    (TW) ............... 94137830 A

(51) Int. Cl.
  *G11C 7/00*    (2006.01)
(52) U.S. Cl. .................... 365/221; 365/230.05
(58) Field of Classification Search ............. 365/221, 365/230.05, 154, 189.12
  See application file for complete search history.

(56) References Cited

U.S. PATENT DOCUMENTS

| | | | | |
|---|---|---|---|---|
| 5,550,780 A | * | 8/1996 | Chu | ............ 365/221 |
| 5,956,748 A | * | 9/1999 | New | ............ 711/149 |
| 6,445,635 B1 | * | 9/2002 | Au et al. | ............ 365/221 |
| 6,611,469 B2 | * | 8/2003 | Williams et al. | ............ 365/221 |
| 2002/0167337 A1 | | 11/2002 | Chelcea et al. | |
| 2004/0128413 A1 | | 7/2004 | Chelcea et al. | |

OTHER PUBLICATIONS

T. Chelcea and S.M. Nowick, "Robust Interfaces for Mixed-Timing Systems", IEEE Trans. VLSI Systems, vol. 12, No. 8, pp. 857-873, Aug. 2004.

* cited by examiner

*Primary Examiner*—Anh Phung
(74) *Attorney, Agent, or Firm*—Rosenberg, Klein & Lee

(57) ABSTRACT

The present invention discloses an asynchronous first-in-first-out cell, wherein modified Muller C elements are used to reduce the complexity of the circuit of the asynchronous first-in-first-out cell; the asynchronous first-in-first-out cell of the present invention not only can be reusable, but also can apply to a single-supply-voltage system with a single clock frequency or multiple clock frequencies and a multiple-supply-voltage system with a single clock frequency or multiple clock frequencies. Further, when the asynchronous first-in-first-out cell of the present invention is applied to the interface circuit of a dual-supply-voltage 16-point radix-$2^2$ GALS-based FFT architecture, considerable power saving and latency reduction can be achieved.

24 Claims, 23 Drawing Sheets

ASYNCHRONOUS FIRST-IN-FIRST-OUT CELL

BACKGROUND OF THE INVENTION

1. Field of the Invention

The present invention relates to an asynchronous first-in-first-out cell, particularly to an asynchronous first-in-first-out cell, which not only can apply to a single-supply-voltage system with a single clock frequency or multiple clock frequencies but also can apply to a multiple-supply-voltage system with a single clock frequency or multiple clock frequencies.

2. Description of the Related Art

The principle of SOC (System on a Chip) design is to achieve high throughput and low latency. Although the performance of a chip can be promoted via increasing operation frequency, the power consumption of the entire chip system will rise obviously, and a great amount of heat is also generated thereby. Further, owing to the increasing communication time between chip modules, it is hard to distribute a single synchronous clock to the whole chip system. Therefore, a chip system not only needs a power management function and a DC-DC conversion function but also should be capable of lowering power consumption under different voltages. The GALS (Globally-Asynchronous Locally-Synchronous) system can handle asynchronous clocks, and in this interface, using asynchronous FIFO (first-in-first-out) cells as temporary storage devices can solve the abovementioned chip-system problems.

However, the conventional asynchronous FIFO design is implemented with the burst mode and a CAD tool, which causes not only further higher circuit complexity but also further more power consumption; therefore, it is hard to apply the conventional asynchronous FIFO design to a dual-supply-voltage system. The US Patents No. 20040128413 and No. 20020167336 disclose FIFO technologies, which can apply to the interface having different clock domains, such as synchronous-synchronous clock domains, synchronous-asynchronous clock domains and asynchronous-asynchronous clock domains; it utilizes a token mechanism and FIFO registers to determine the storage device where data is to be stored; in the synchronous clock domain, circular shift registers are used to form the token mechanism, and S-R (set-reset) flip-flops are used to form a state detector; in the asynchronous clock domain, a handshake controller, a CAD tool and the burst mode are used to obtain a put token, a get token and a data validity controller. However, from the overview of the US Patents No. 20040128413 and No. 20020167336, too many logic gates are used therein, which complicates the circuit structure and increases the power consumption.

Accordingly, the present invention proposes an asynchronous first-in-first-out cell, which not only can reduce circuit complexity and power consumption, but also can apply to a single-supply-voltage system with a single clock frequency or multiple clock frequencies and a multiple-supply-voltage system with a single clock frequency or multiple clock frequencies.

SUMMARY OF THE INVENTION

The primary objective of the present invention is to provide an asynchronous first-in-first-out cell, which comprises modified Muller C elements and can reduce circuit complexity and power consumption.

Another objective of the present invention is to provide an asynchronous first-in-first-out cell, which not only is reusable but also can apply to a single-supply-voltage system with a single clock frequency or multiple clock frequencies and a multiple-supply-voltage system with a single clock frequency or multiple clock frequencies.

Yet another objective of the present invention is to provide an asynchronous first-in-first-out cell, which can avoid the data transparent problem in the first-in-first-out cell.

Still another objective of the present invention is to provide an asynchronous first-in-first-out cell, which cooperates with voltage-level conversion to prevent the unnecessary power consumption occurring in a dual-supply-voltage system when data is transferred from a low voltage module to a high voltage module.

Further another objective of the present invention is to provide an asynchronous first-in-first-out cell, which can apply to the interface circuit of a dual-supply-voltage 16-point radix-$2^2$ GALS-based FFT (Fast Fourier Transform) architecture to achieve more power saving and more latency reduction.

To achieve the abovementioned objectives, the present invention proposes an asynchronous first-in-first-out cell, which is positioned between two adjacent asynchronous wrappers—a first asynchronous wrapper and a second asynchronous wrapper, and comprises: a data latch, responsible for accessing data; a full/empty detector, responsible for detecting the state of the data latch; a sender's handshake controller, responsible for sending a Sack (sender's acknowledge) signal to the first asynchronous wrapper; and a receiver's handshake controller, responsible for sending a Rack (receiver's acknowledge) signal to the second asynchronous wrapper, wherein the full/empty detector, sender's handshake controller and receiver's handshake controller all adopt modified Muller C circuits so that the circuit complexity can be reduced, and the modified Muller C circuit of the sender's handshake controller can receive the Rack signal generated by the receiver's handshake controller, which can enable input data to be temporarily stored in the data latch lest there should be a data transparent problem from the input end to the output end.

When the asynchronous first-in-first-out cell of the present invention is applied to a dual-supply-voltage system, wherein the first asynchronous wrapper is externally coupled to a lower supply voltage ($V_{DDL}$), and the second asynchronous wrapper is externally coupled to a higher supply voltage ($V_{DDH}$), an asynchronous level converter is further installed between the full/empty detector and the receiver's handshake controller, and an LCFF (level converter flip-flop) is further embedded in the data latch, which can reduce the latency and power consumption when data is transferred from a low voltage module to a high voltage module. Further, when the asynchronous first-in-first-out cell of the present invention is applied to the dual-supply-voltage 16-point radix-$2^2$ GALS-based FFT architecture, considerable power saving and latency reduction can be achieved.

The abovementioned architecture primarily comprises three wrappers—an asynchronous wrapper 1, an asynchronous wrapper 2 and an asynchronous wrapper 3; each wrapper has it own clock frequency and operation voltage; both the asynchronous wrapper 1 and the asynchronous wrapper 3 are externally coupled to $V_{DDL}$, and the asynchronous wrapper 2 is externally coupled to $V_{DDH}$; the interface between the asynchronous wrapper 1 and the asynchronous wrapper 2 is implemented with the dual-supply-voltage GALS architecture of the asynchronous FIFO cell, and the interface between the asynchronous wrapper 2 and the asynchronous wrapper 3 is implemented with a D flip-flop and the handshaking circuit modified by the asynchronous level converter.

To enable the objectives, technical contents, characteristics and accomplishments of the present invention to be more easily understood, the embodiments of the present invention are to be described below in detail in cooperation with the attached drawings.

DETAILED DESCRIPTION OF THE INVENTION

The present invention discloses an asynchronous first-in-first-out cell, which not only can apply to a single-supply-voltage GALS system with a single clock frequency or multiple clock frequencies and a multiple-supply-voltage GALS system with a single clock frequency or multiple clock frequencies, but also can apply to the interface circuit of a dual-supply-voltage 16-point radix-$2^2$ GALS-based FFT architecture and achieve less power consumption and more latency reduction therein.

Figure 1:
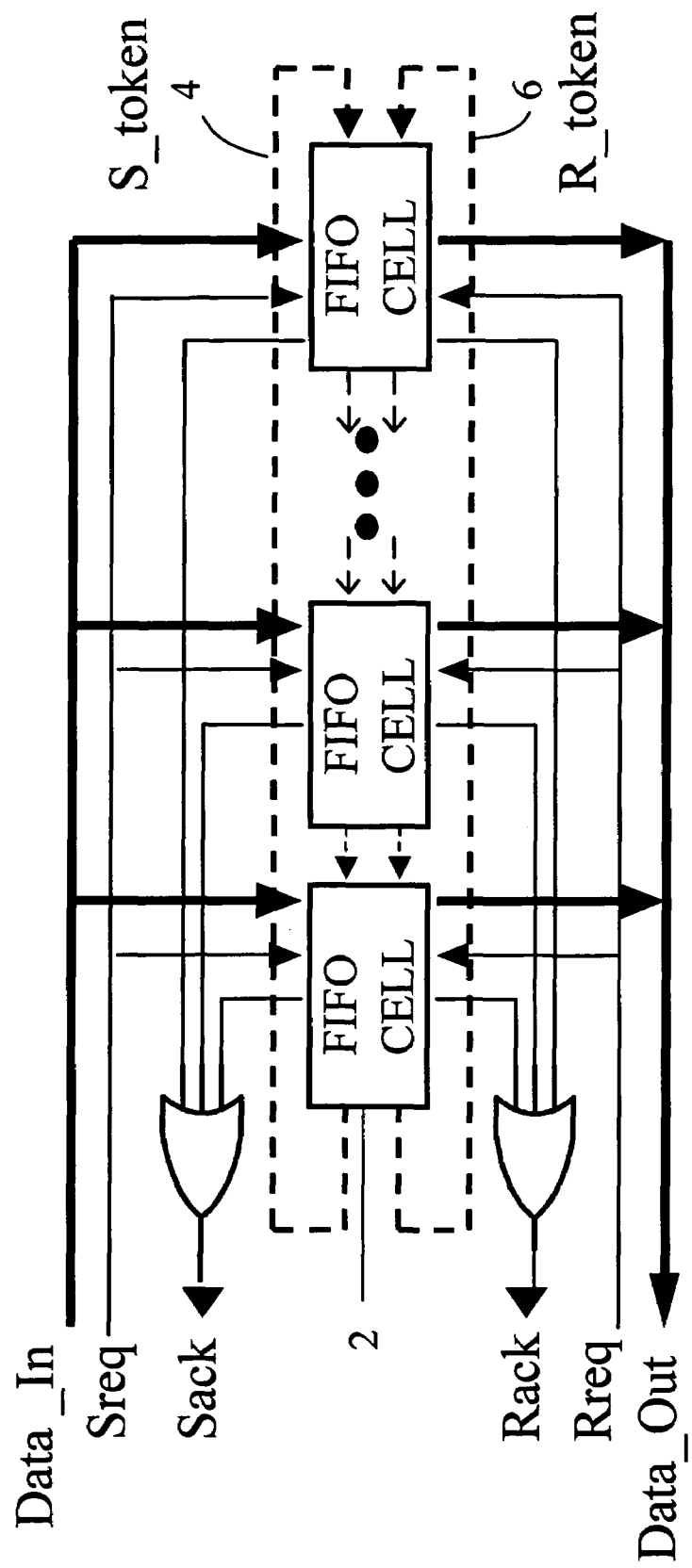
FIG. 1 is a diagram schematically showing the architecture of the asynchronous FIFO cells of the present invention.
Figure 2:
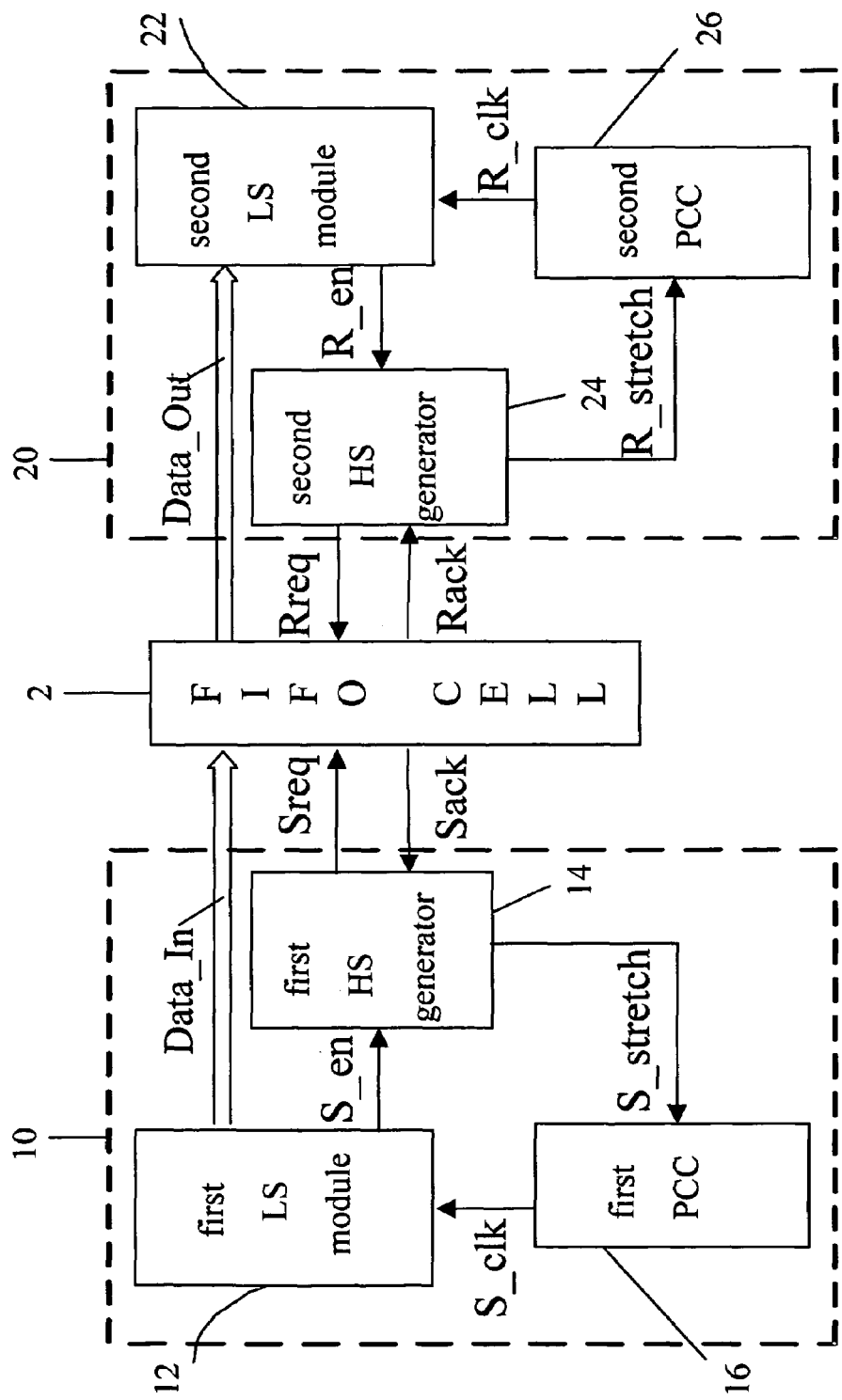
FIG. 2 is a diagram schematically showing the interface structure of the asynchronous FIFO cell of the present invention used in a GALS system.

As shown in FIG. 1 a diagram schematically showing the architecture of the asynchronous first-in-first-out cell of the present invention, multiple continuous asynchronous first-in-first-out (FIFO) cells 2 are used as storage devices, which utilize an S_token (sender's token) 4 and a R_token (receiver's token) 6 to control the input/output of data, wherein only the asynchronous FIFO cells 2 having the S_token 4 can be used to temporarily store data, and only the asynchronous FIFO cells 2 having the R_token 6 can output the data temporarily stored in the asynchronous FIFO cells 2. The operation of the asynchronous FIFO cell 2 having the S_token 4 and the R_token 6 is to be further discussed below. As shown in FIG. 2 a diagram schematically showing the application of the asynchronous FIFO cell 2 having the S_token 4 and the R_token 6 to the interface of a single-supply-voltage GALS system, an asynchronous FIFO cell 2 is installed between a first asynchronous wrapper 10 and a second asynchronous wrapper 20; the first asynchronous wrapper 10 comprises: a first locally-synchronous module 12, a first handshake generator 14 and a first plausible clock controller 16, and the second asynchronous wrapper 20 comprises: a second locally-synchronous module 22, a second handshake generator 24 and a second plausible clock controller 26.

As the asynchronous FIFO cell 2 in FIG. 2 has the S_token 4, it can receive an Sreq (sender's request) signal generated by the first handshake generator 14, and it does not send a Sack (sender's acknowledge) signal to the first handshake generator 14 until the asynchronous FIFO cell 2 having the S_token 4 has space to store data, and once the asynchronous first-in-first-out cell 2 having the S_token 4 begins to temporarily store data, the S_token 4 is sent to the next asynchronous first-in-first-out cell 2 shown in FIG. 1. As the asynchronous FIFO cell 2 in FIG. 2 has the R_token 6, the asynchronous FIFO cell 2 can output the data temporarily stored therein and can receive an Rreq (receiver's request) signal generated by the second handshake generator 24, and it does not send a Rack (receiver's acknowledge) to the second handshake generator 24 until the asynchronous FIFO cell 2 having the R_token 6 has temporarily-stored data to output, and once the asynchronous FIFO cell 2 having the R_token 6 begins to output the temporarily-stored data, the R_token 6 is sent to the next asynchronous FIFO cell 2 shown in FIG. 1.

Figure 3:
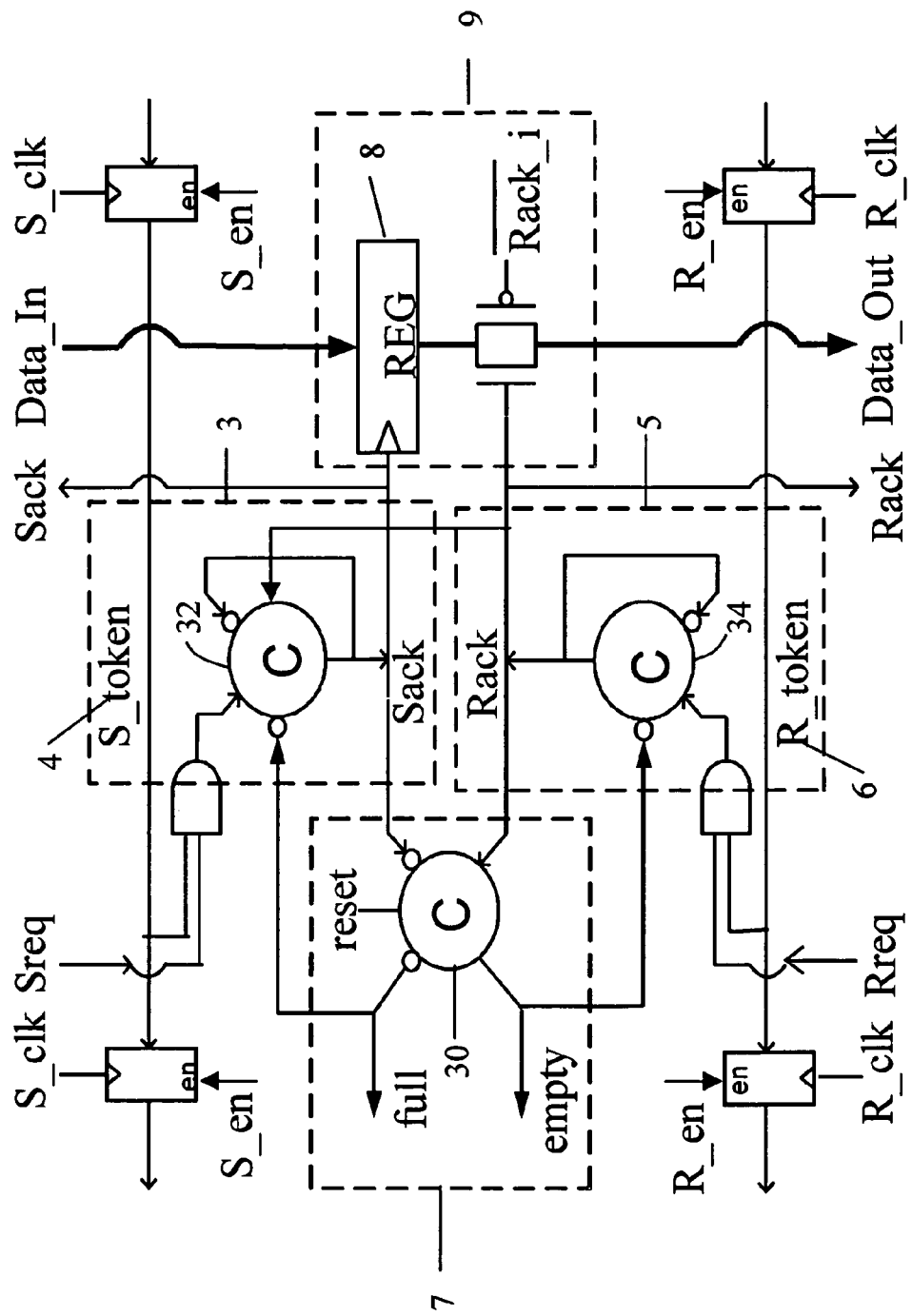
FIG. 3 is a diagram schematically showing that the asynchronous FIFO cell is applied to a single-supply-voltage system according to a preferred embodiment of the present invention.

In a first preferred embodiment of the present invention, the single-voltage-supply FIFO cell proposed in FIG. 3 is applied to the interface structure of a single-supply-voltage GALS system shown in FIG. 2. As shown in FIG. 2 and FIG. 3, the single-voltage-supply FIFO cell comprises: a data latch 9, having a register 8 responsible for accessing data; a full/empty detector 7, responsible for detecting the accessing statute of the data latch 9; a sender's handshake controller 3, responsible for sending a Sack signal to the first handshake generator 14; and a receiver's handshake controller 5, responsible for sending a Rack signal to the second handshake generator 24.

When the first locally-synchronous module 12 intends to send data to the data latch 9, a first enable signal S_en is sent to the first handshake generator 14 firstly, and at this moment, the first enable signal S_en is on the rising clock edge, which activates the first handshake generator 14 to undertake signal conversion, and then, the first handshake generator 14 generates a pulse and a sender's request signal Sreq and sends Sreq to the sender's handshake controller 3, and the first handshake generator 14 also generates a first stretch signal S_stretch and sends it to the first plausible clock controller 16. The sender's handshake controller 3 having the S_token 4 of the asynchronous FIFO cell will receive the sender's request signal Sreq, and when the data latch 9 still has space to store data, the sender's handshake controller 3 will send a Sack signal to the first handshake generator 14. When the first plausible clock controller 16 receives the first stretch signal S_stretch, it will send a first local clock signal S_clk to the first locally-synchronous module 12. When data is input to the asynchronous FIFO cell, the first plausible clock controller 16 can prolong or stop the first local clock signal S_clk lest the time that the first stretch signal S_stretch arrives at the first plausible clock controller 16 be too close to the time that data is processed and lest the synchronization should fail. When the first locally-synchronous module 12 receives the first local clock signal S_clk, it will input data into the data latch 9.

After data is input to the data latch 9 and temporarily stored therein, and when the second locally-synchronous module 22 intends to receive the data temporarily stored in the data latch 9, it will send a second enable signal R_en to the second handshake generator 24 firstly, and at this moment, the second enable signal R_en is on the rising clock edge, which activates the second handshake generator 24 to undertake signal conversion, and then, the second handshake generator 24 generates a pulse and a receiver's request signal Rreq and sends Rreq to the receiver's handshake controller 5, and the second handshake generator 24 also generates a second stretch signal R_stretch and send it to the second plausible clock controller 26. The receiver's handshake controller 5 having the R_token 6 of the asynchronous FIFO cell will receive the receiver's request signal Rreq, and when the data latch 9 has data stored therein, the receiver's handshake controller 5 will send a Rack signal to the second handshake generator 24. When the second plausible clock controller 26 receives the second stretch signal R_stretch, it will send a second local clock signal R_clk to the second locally-synchronous module 22. When data is output from the data latch 9, the second plausible clock controller 26 can prolong or stop the second local clock signal R_clk lest the time that the second stretch signal R_stretch arrives at the second plausible clock controller 26 be too close to the time that data is processed and lest the synchronization should fail. When the second locally-synchronous module 22 receives the second local clock signal R_clk, the second locally-synchronous module 22 will receive the data stored in the data latch 9.

Figure 4:
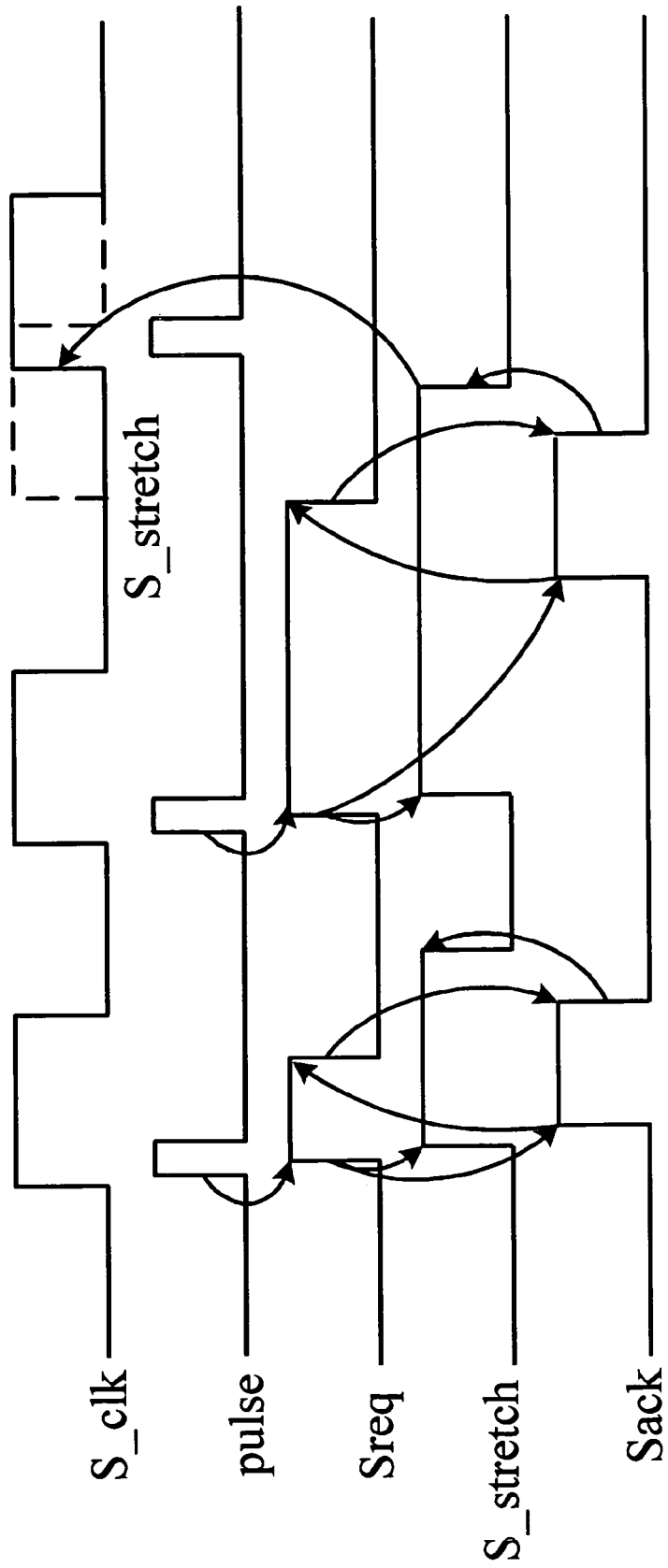
FIG. 4 is a diagram schematically showing the signal conversion process between the first handshake generator and the first plausible clock controller according to the present invention.
Figure 5A:
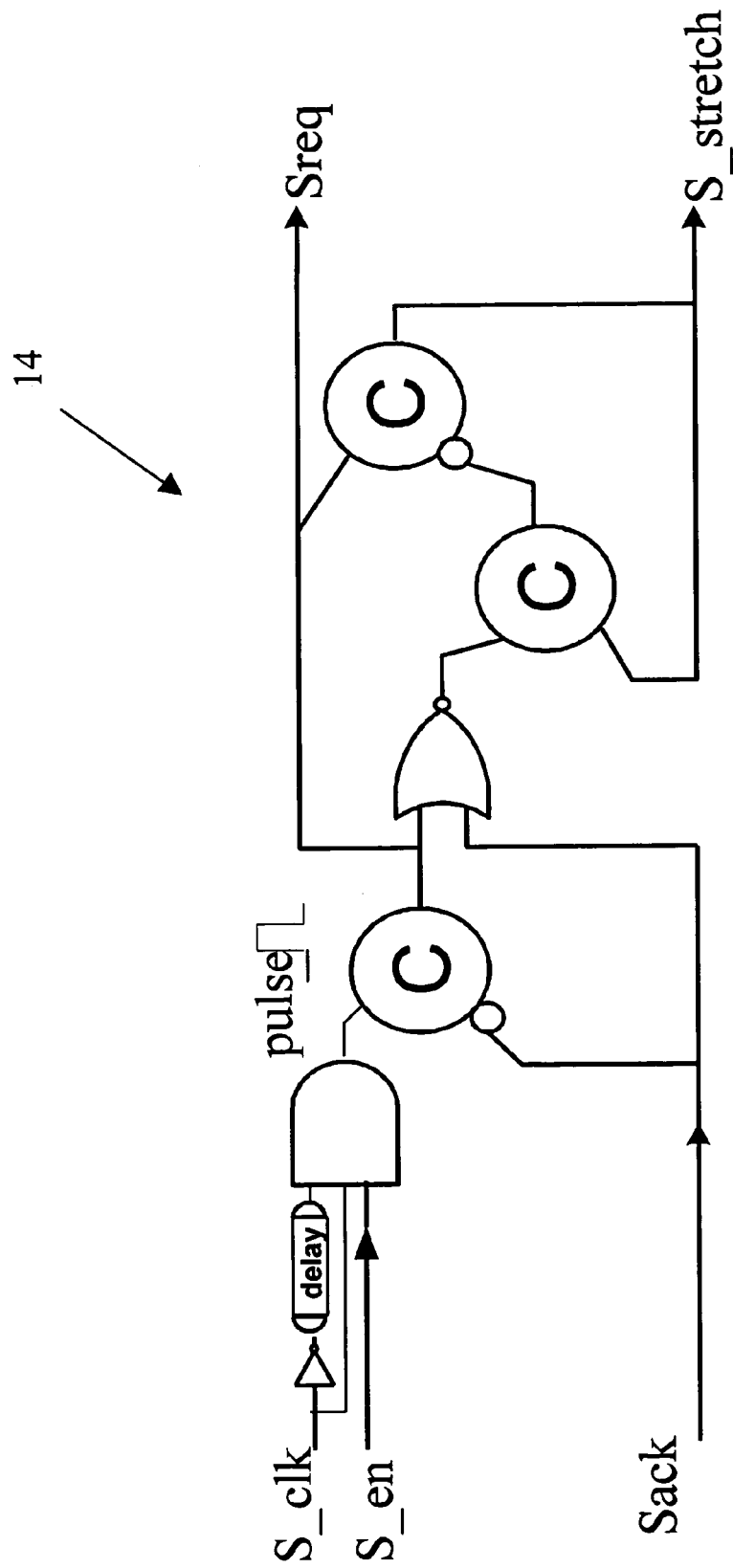
FIG. 5(a) is a diagram schematically showing the physical structure of the first handshake generator according to the present invention.
Figure 5B:
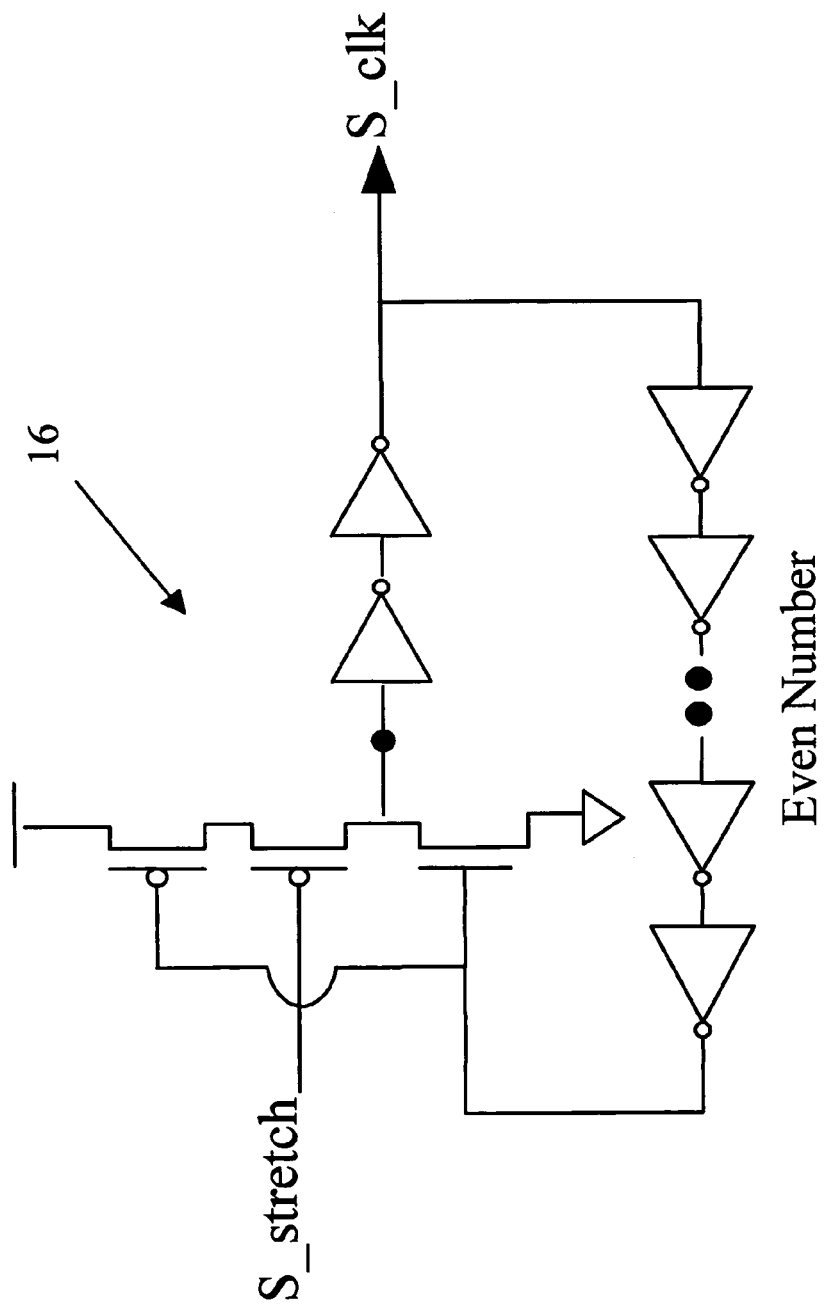
FIG. 5(b) is a diagram schematically showing the physical structure of the first plausible clock controller according to the present invention.

As shown in FIG. 4, the signal conversion process of the first handshake generator 14 and the first plausible clock controller 16 is: $S\_en^+ \rightarrow pulse^+ \rightarrow Sreq^+ \rightarrow S\_stretch^+ \rightarrow pulse^- \rightarrow Sack^+ \rightarrow Sreq^- \rightarrow Sack^- \rightarrow S\_stretch^-$, wherein "+" represents "on the rising clock edge" and "−" represents "on the falling clock edge". The signal conversion process similar to that mentioned above also occurs in the interface between the second asynchronous wrapper 20 and the asynchronous FIFO cell 2. FIG. 5(*a*) shows the physical structure of the first handshake generator 14, wherein Muller C elements are used and the area overhead is reduced, and the physical structure of the second handshake generator 24 which receives the second enable signal R_en , the receiver's acknowledge signal Rack and generates the second stretch signal R_strectch , the receiver's request signal Rreq is shown as FIG. 5(*a*). FIG. 5(*b*) shows the physical structure of the first plausible clock controller 16, wherein after the falling edge of first stretch signal S_stretch, the first local clock signal S_clk will only re-oscillate for a short period of time; thus, the delay time of the first local clock signal S_clk is decreased, and power consumption is also reduced, and the physical structure of the second plausible clock controller 26 which receives the second stretch signal R_strectch and generates the second local clock signal R_clk is shown as FIG. 5(*b*).

Figures 6A, 6B:
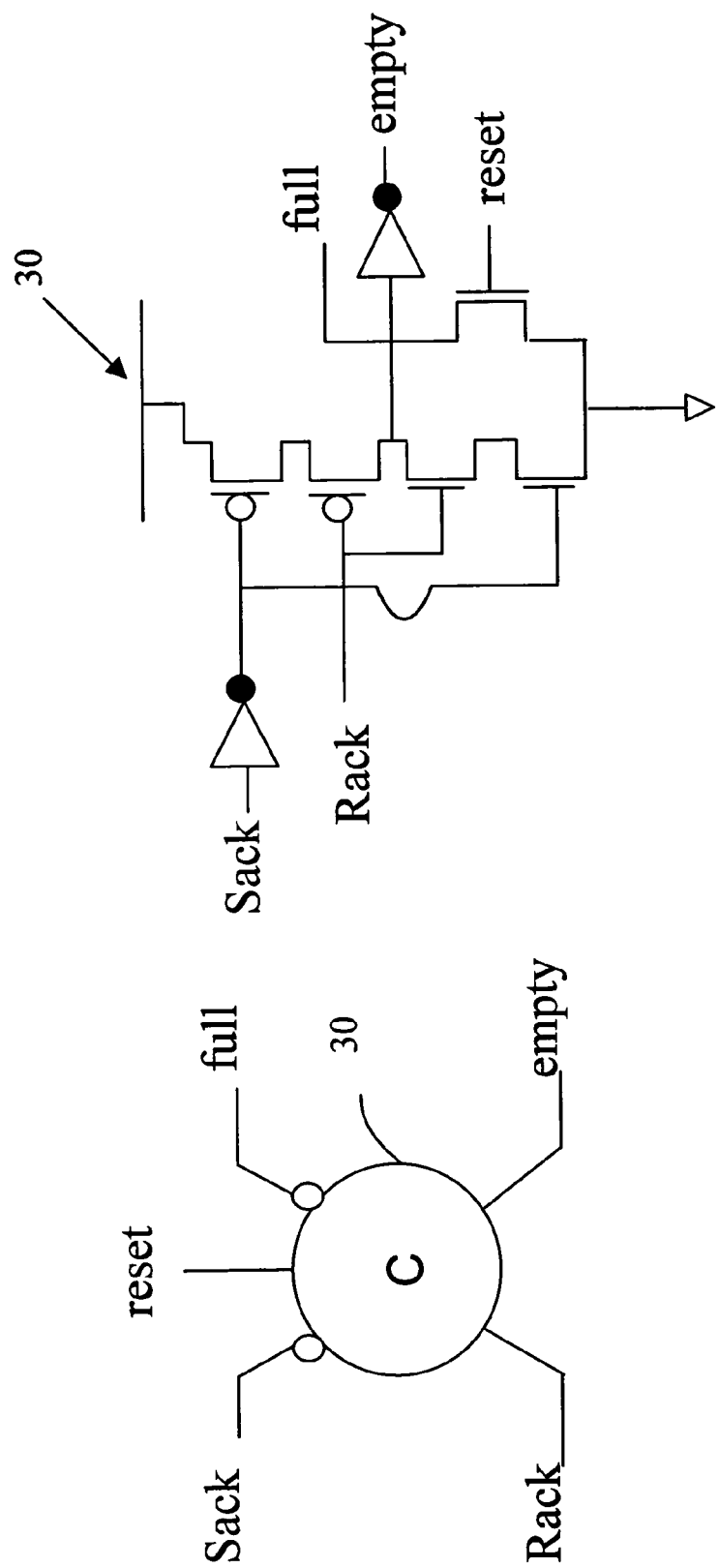
FIG. 6(a) is a schematic diagram of the modified Muller C element according to the present invention.
FIG. 6(b) is a diagram schematically showing the physical structure of the modified Muller C element according to the present invention.

The full/empty detector 7 is composed of a modified Muller C element 30, and please respectively refer to FIG. 6(*a*) and FIG. 6(*b*) for a schematic diagram of the modified Muller C element 30 and a diagram showing the physical structure of the modified Muller C element 30. The full/empty detector 7 detects whether the data storage state of the data latch 9 is full or empty; when there is data stored in the data latch 9, the full/empty detector 7 sets the "full" state (defines full=1 and empty=0), and when there is no data stored in the data latch 9, the full/empty detector 7 sets the "empty" state (defines empty=1 and full=0). The sender's request signal Sreq and the sender's acknowledge signal Sack are input to the modified Muller C element 30 to determine whether it is full=1 or empty=1. The modified Muller C element 30 has an input end for a reset signal. Initially, the reset signal will cause the data latch 9 to be empty. For the FIFO cell, when Sreq=1, data will be stored in the data latch 9, and full=1; when Rreq=1, the data stored in the data latch 9 will be output, and full=1 will become empty=1, wherein Sreq=1 and Rreq=1 cannot exist simultaneously lest there be a transparent problem from the input data to the output data so that the input data can be temporarily stored in the data latch 9. In conclusion, the operational mechanism of the full/empty detector 7 is:

---
If Sack=1, then full->0;
Else If Rack=1, then empty->1,
--- wherein Sack=1 and Rack=1 cannot exist simultaneously.

Figure 7B:
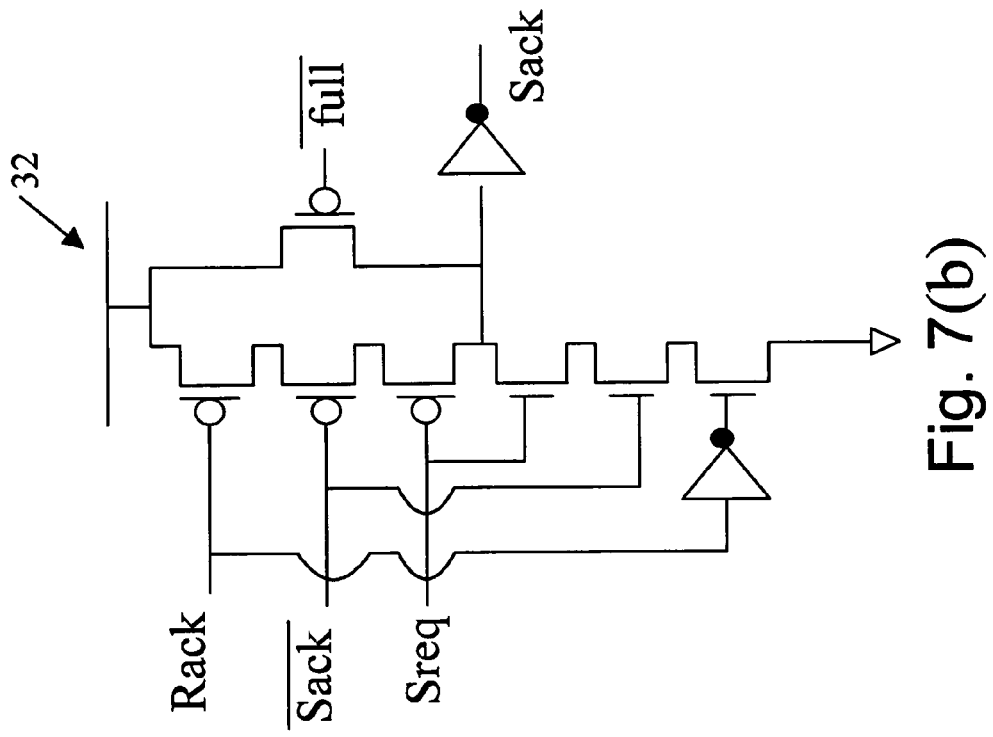
FIG. 7(b) is a diagram schematically showing the physical structure of the modified Muller C element according to the present invention.
Figure 7A:
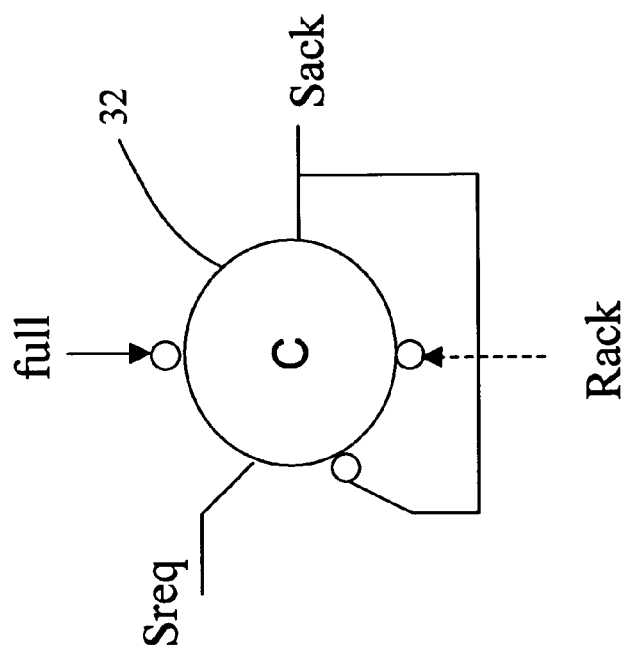
FIG. 7(a) is a schematic diagram of the modified Muller C element according to the present invention.

The aim of the sender's handshake controller 3 is to send the sender's acknowledge signal Sack to the first handshake generator 14. The sender's handshake controller 3 is composed of a modified Muller C element 32, and please respectively refer to FIG. 7(*a*) and FIG. 7(*b*) for a schematic diagram of the modified Muller C element 32 and a diagram showing the physical structure of the modified Muller C element 32. When the first handshake generator 14 sends the sender's request signal Sreq to the S_token 4-containing sender's handshake controller 3, the operational mechanism of the sender's handshake controller 3 is:

---
If full=1, then Sack->0;
Else If Rack=1, then Sack -> 0 (unchanged);
Else If Sreq=1, then Sack ->1;
Else If Sreq=0, then Sack ->0,
--- wherein "If Rack=1, then Sack->0(unchanged)" is to avoid that Sreq=1 and Rreq=1 exists simultaneously, i.e. after Rack=0 and the data temporarily stored in the data latch 9 is not output, the Sack will be 1, and data gets ready to input. Therefore, the data transparent problem will be avoided.

Figure 8B:
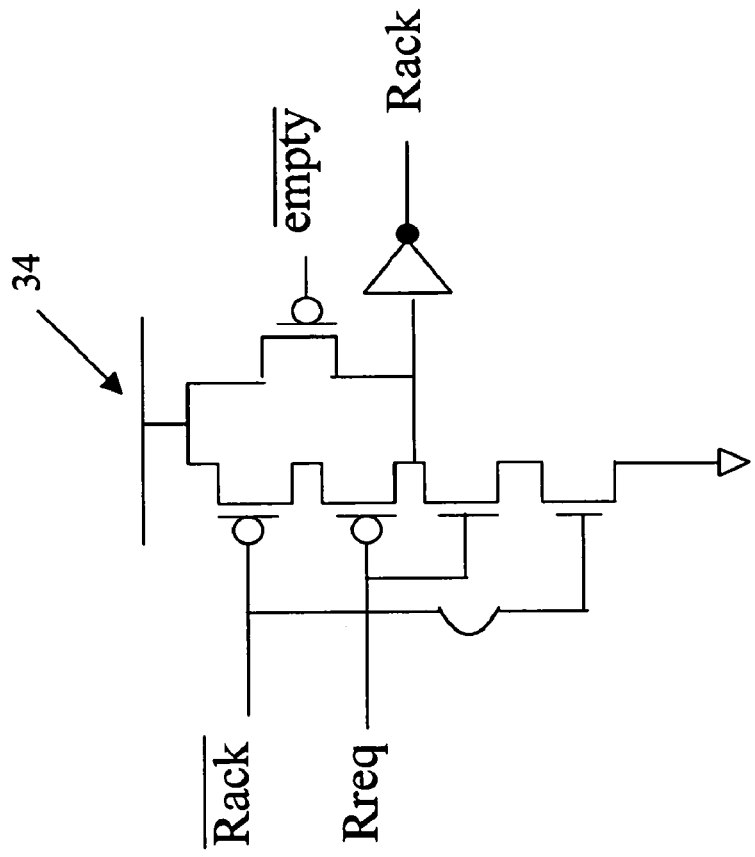
FIG. 8(b) is a diagram schematically showing the physical structure of the modified Muller C element according to the present invention.
Figure 8A:
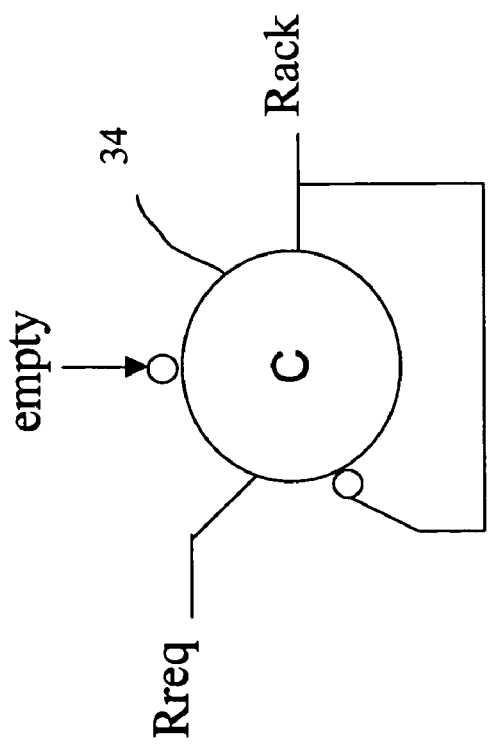
FIG. 8(a) is a schematic diagram of the modified Muller C element according to the present invention.

The aim of the receiver's handshake controller 5 is to send the receiver's acknowledge signal Rack to the second handshake generator 24. The receiver's handshake controller 5 is composed of a modified Muller C element 34, and please respectively refer to FIG. 8(*a*) and FIG. 8(*b*) for a schematic diagram of the modified Muller C element 34 and a diagram showing the physical structure of the modified Muller C element 34. When the second handshake generator 24 sends the sender's request signal Sreq to the receiver's handshake controller 5 with R_token 6, the operational mechanism of the receiver's handshake controller 5 is:

---
If empty=1, then Rack->0;
Else If Rreq=1, then Rack ->1;
Else If Rreq=0, then Rack ->0.
---

When the asynchronous FIFO cell shown in FIG. 2 is a dual-supply-voltage GALS interface structure, the first asynchronous wrapper 10 will be externally coupled to a first supply voltage $V_{DDL}$, and the second asynchronous wrapper 20 will be externally coupled to a second supply voltage $V_{DDH}$, and the second supply voltage $V_{DDH}$ is greater than the first supply voltage $V_{DDL}$.

Figure 9:
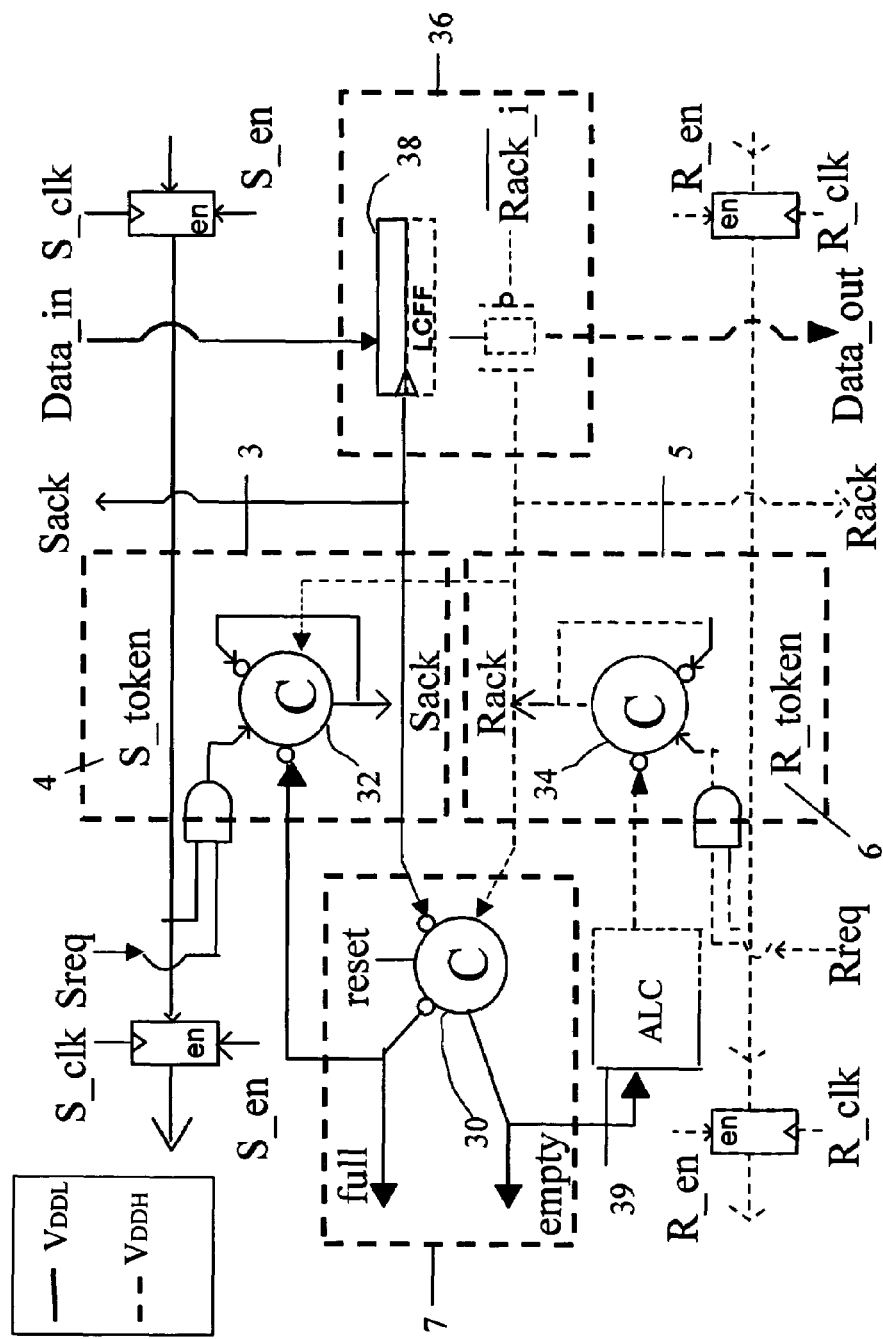
FIG. 9 is a diagram schematically showing that the asynchronous FIFO cell is applied to a dual-supply-voltage system according to a preferred embodiment of the present invention.

In a second preferred embodiment of the present invention, the dual-supply-voltage asynchronous FIFO cell proposed in FIG. 9 is applied to the interface structure in FIG. 2, wherein the asynchronous FIFO cell 2 is a dual-supply-voltage GALS system. In the dual-supply-voltage asynchronous FIFO cell shown in FIG. 9, solid lines are externally coupled to the first supply voltage $V_{DDL}$, and the dashed lines are externally coupled to the second supply voltage $V_{DDH}$. The structure of the dual-supply-voltage asynchronous FIFO cell shown in FIG. 9 is similar to the structure of the single-supply-voltage asynchronous FIFO cell shown in FIG. 3 and also comprises: a data latch 36, responsible for accessing data; a full/empty detector 7, responsible for detecting the accessing state of the data latch 36; a sender's handshake controller 3, responsible for sending a Sack signal to the first handshake generator 14; and a receiver's handshake controller 5, responsible for sending a Rack signal to the second handshake generator 24; however, herein the data latch 36 further comprises an LCFF (level converter flip-flop) 38, and an ALC (asynchronous level converter) 39 is further installed between the receiver's handshake controller 5 and the full/empty detector 7.

Figure 10B:
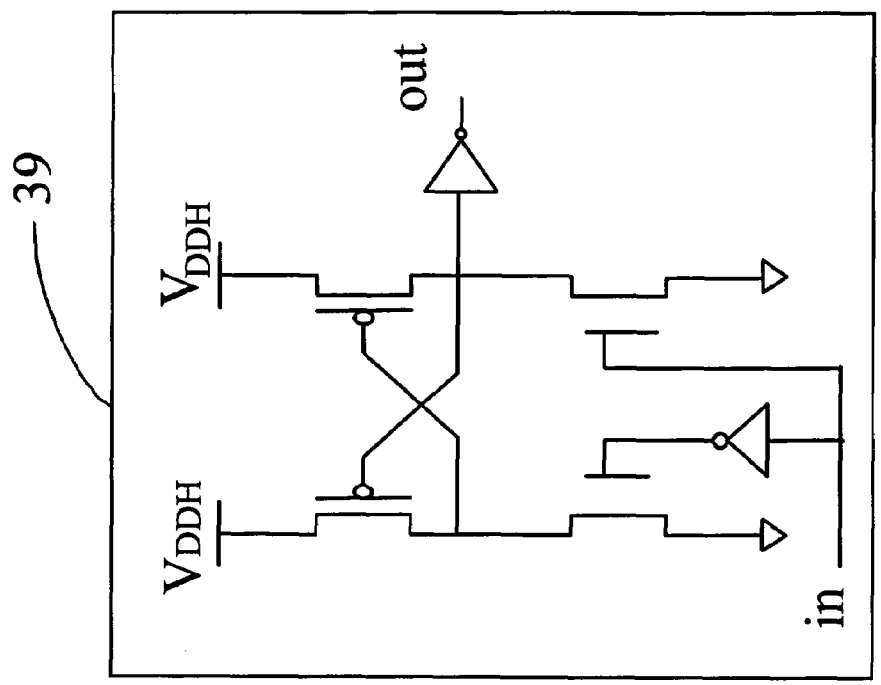
FIG. 10(b) is a diagram schematically showing the physical structures of asynchronous level converter according to the present invention.
Figure 10A:
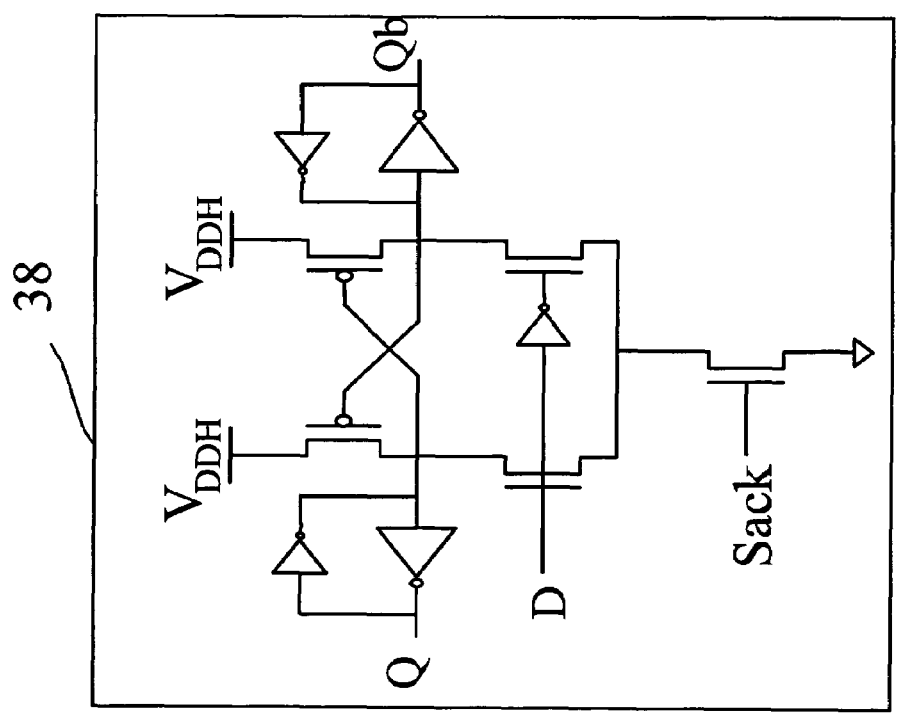
FIG. 10(a) is a diagram schematically showing the physical structures of level converter flip-flop according to the present invention.

The externally-coupled first supply voltage $V_{DDL}$ may have to drive the input end of the externally-coupled second supply voltage $V_{DDH}$. When the P-type transistor driven by the first supply voltage $V_{DDL}$ has not completely turned off yet, the latency of the data transmission from low voltage to high voltage will increase, and a direct current will flow through the P-type transistor. In order to solve the above-mentioned problem, the ALC (asynchronous level converter) 39 is installed between the receiver's handshake controller 5 and the full/empty detector 7 to convert the first supply voltage $V_{DDL}$ into the second supply voltage $V_{DDH}$. The LCFF (level converter flip-flop) 38 of the data latch 36 has flip-flop and level conversion functions and can reduce latency and power consumption; as LCFF 38 adopts a pulsed flip-flop, it just likes a pulse when LCFF 38 samples Sack signals, and thus, no pulse generator is needed. Please respectively refer to FIG. 10(*a*) and FIG. 10(*b*) for the physical structures of LCFF 38 and ALC 39.

Similar to the single-supply-voltage asynchronous FIFO cell shown in FIG. 3, the full/empty detector, sender's handshake controller, and receiver's handshake controller of the dual-supply-voltage asynchronous FIFO cell shown in FIG. 9 also respectively utilize the modified Muller C elements 30, 32, 34. When the dual-supply-voltage asynchronous FIFO cell shown in FIG. 9 is applied to the dual-supply-voltage GALS system, the signal conversion process of the interface structure is also similar to that of the first preferred embodiment.

Figure 11A:
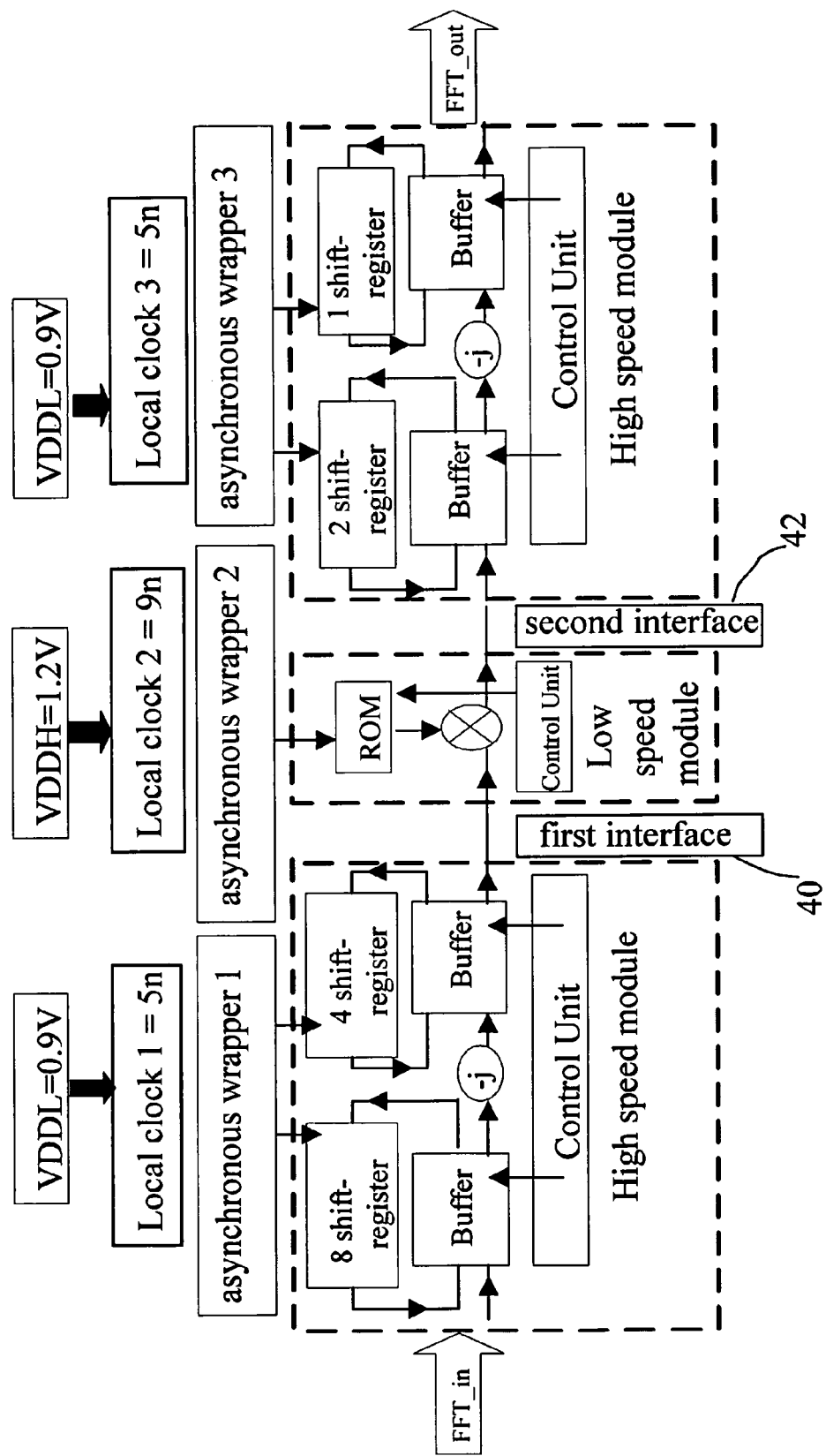
FIG. 11(a) is a diagram schematically showing a GALS-based dual-supply-voltage FFT architecture according to the present invention.
Figure 11B:
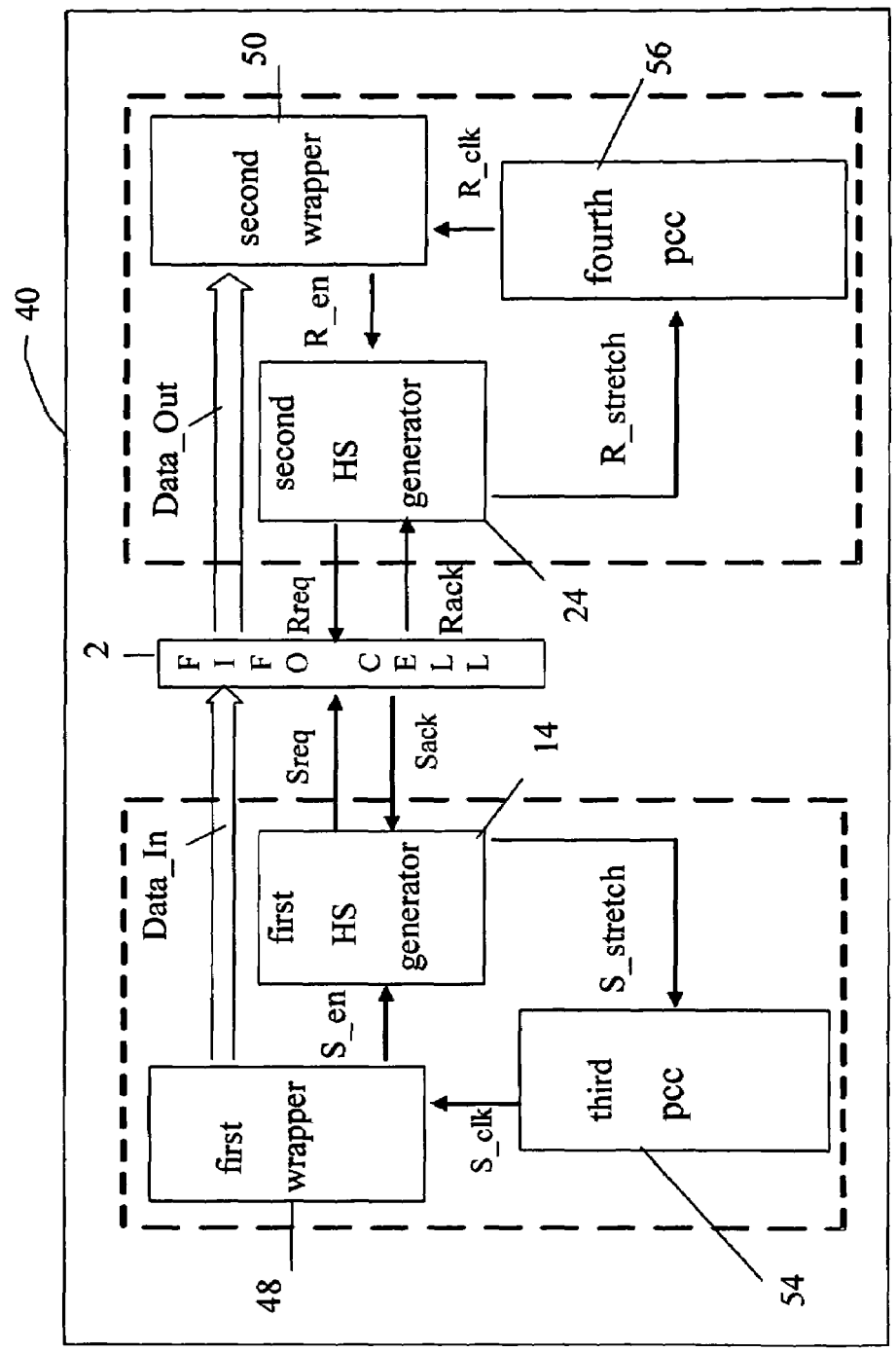
FIG. 11(b) is a diagram schematically showing a first interface of a GALS-based dual-supply-voltage FFT architecture according to the present invention.
Figure 11C:
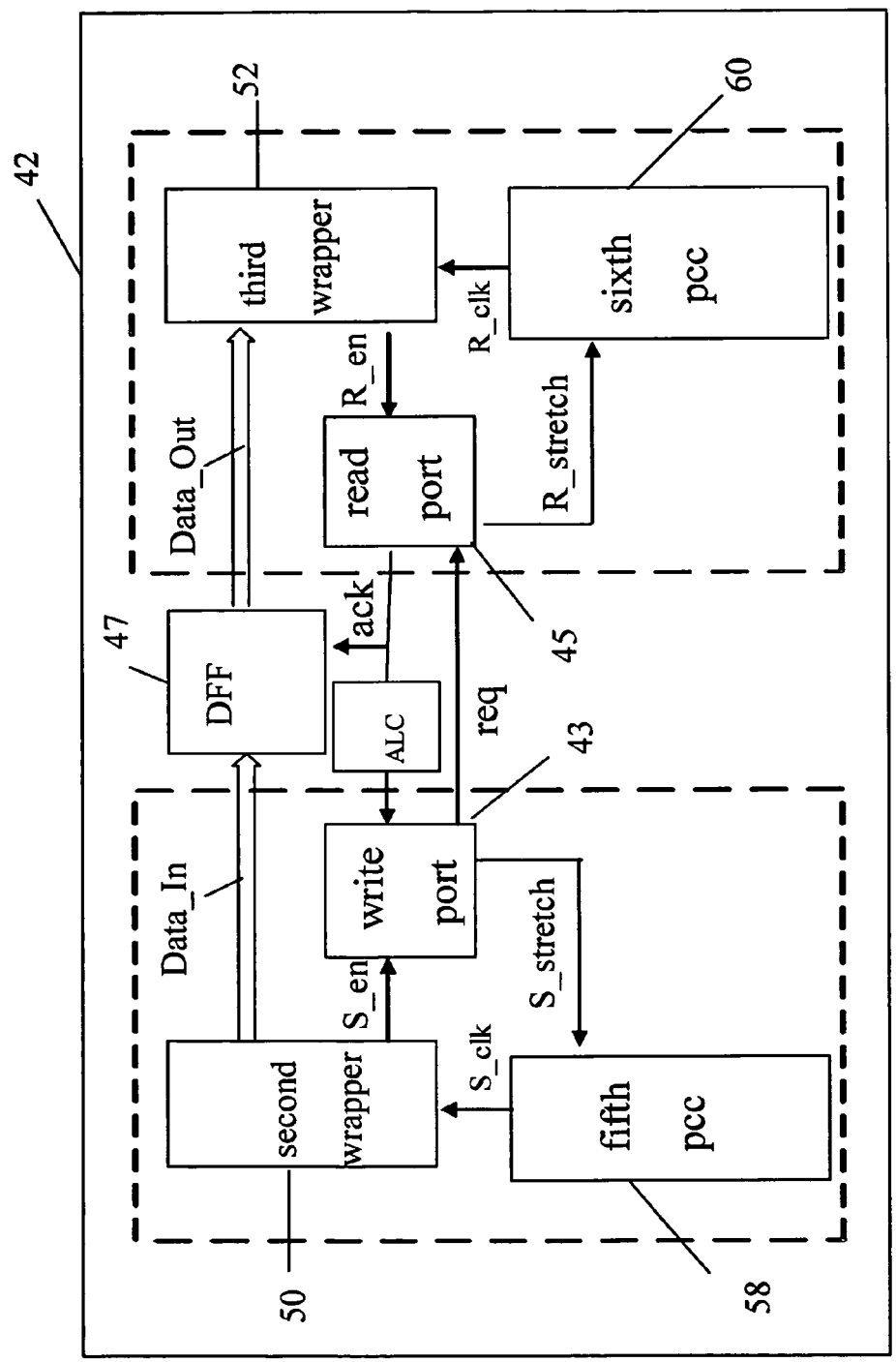
FIG. 11(c) is a diagram schematically showing a second interface of a GALS-based dual-supply-voltage FFT architecture according to the present invention.
Figure 12:
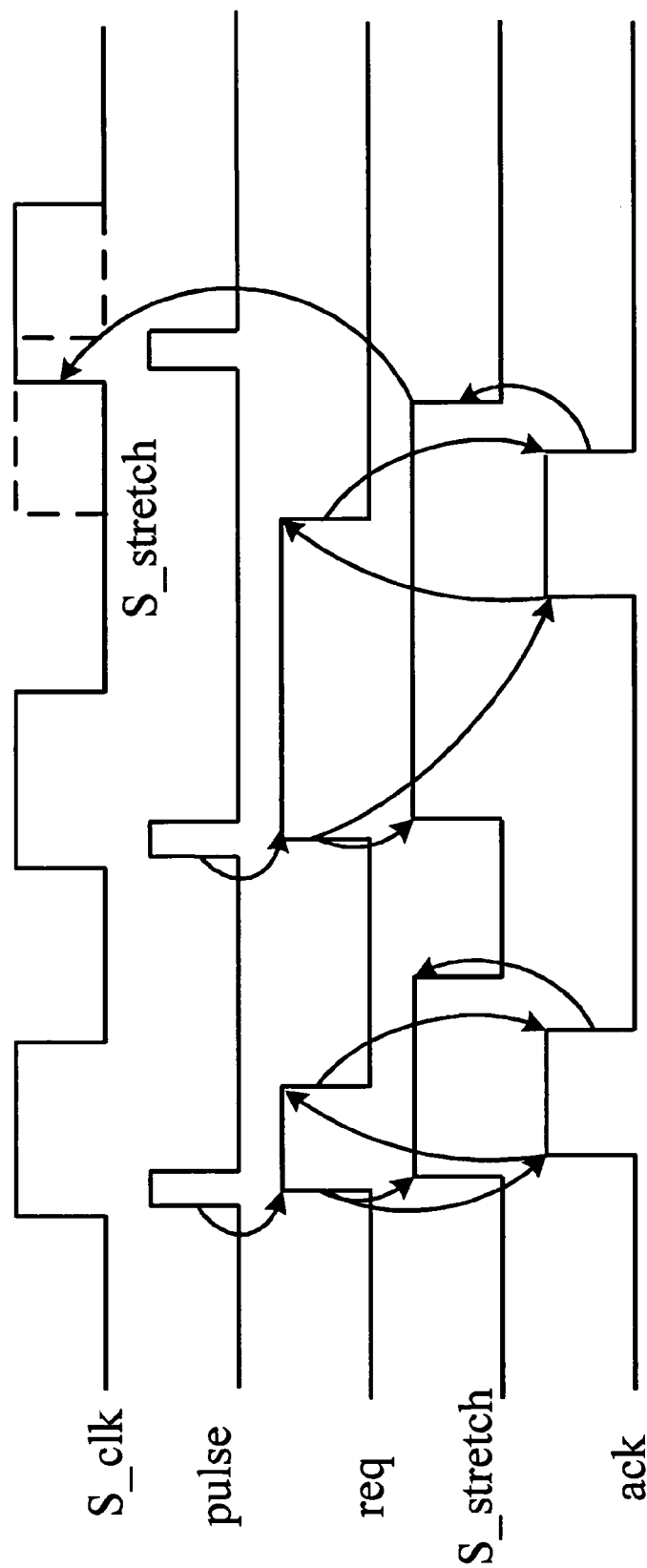
FIG. 12 is a diagram schematically showing the signal conversion process between the write-port and the fifth plausible clock controller in the second interface of the GALS-based dual-supply-voltage FFT architecture according to the present invention.
Figure 13:
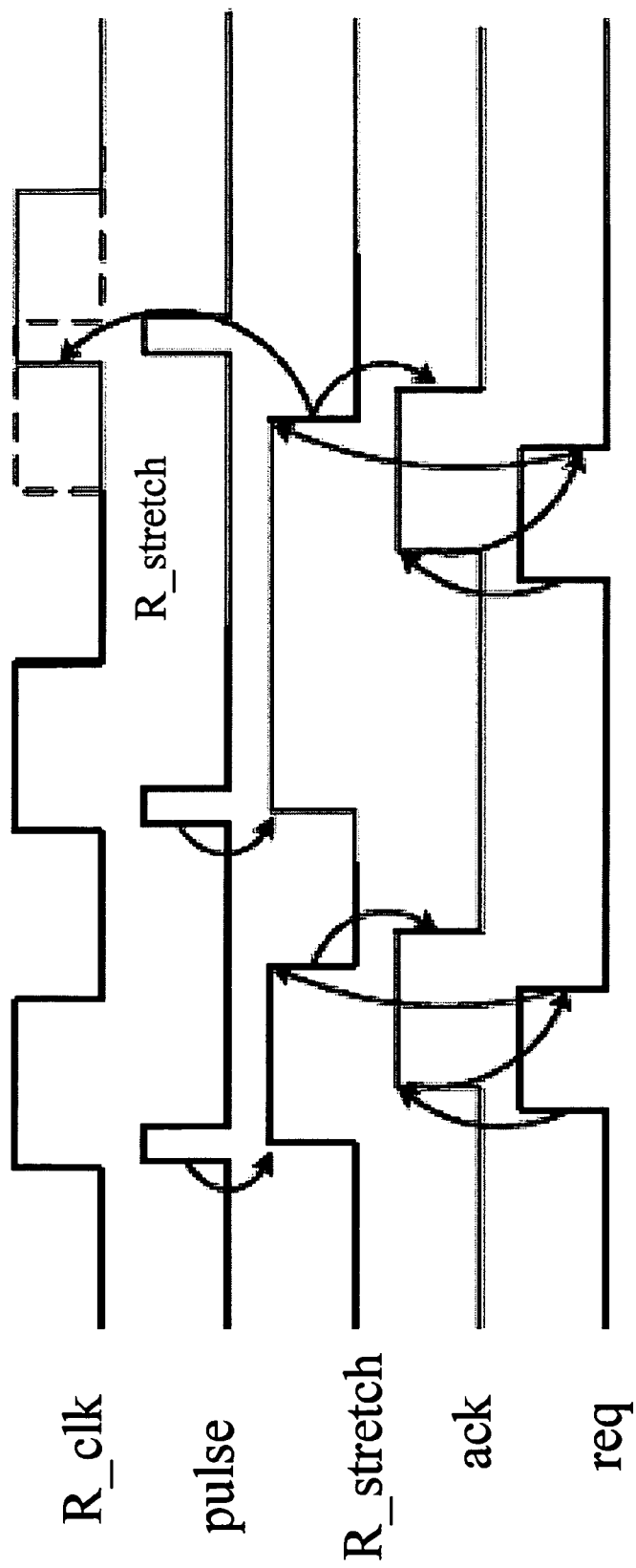
FIG. 13 is a diagram schematically showing the signal conversion process between the read-port and the sixth plausible clock controller in the second interface of the GALS-based dual-supply-voltage FFT architecture according to the present invention.

In a third preferred embodiment of the present invention, the abovementioned dual-supply-voltage asynchronous FIFO cell is applied to a dual-supply-voltage 16-point radix-$2^2$ GALS-based FFT architecture. As shown in FIG. 11(*a*), this architecture has three asynchronous wrapper—a asynchronous wrapper 1, a asynchronous wrapper 2 and a asynchronous wrapper 3; the asynchronous wrapper 1 and the asynchronous wrapper 3 are externally coupled to $V_{DDL}$=0.9V, and the asynchronous wrapper 2 is externally coupled to $V_{DDH}$=1.2V. As shown in FIG. 11(*b*), the GALS interface architecture of the dual-supply-voltage asynchronous FIFO cell is positioned at a first interface 40 between the asynchronous wrapper 1 and the asynchronous wrapper 2; as shown in FIG. 11(*c*), an asynchronous architecture composed of a DFF (D flip-flop) 47 and an ALC (asynchronous level converter) 39 is positioned at a second interface 42 between the asynchronous wrapper 2 and the asynchronous wrapper 3. The write-port 43 of the second interface 42 is equivalent to the first handshake generator 14, and the read-port 45 of the second interface 42 is equivalent to the second handshake generator 24; FIG. 12 shows the signal conversion process between the write-port 42 and the fifth plausible clock controller 58, and FIG. 13 shows the signal conversion process between the read-port 45 and the sixth plausible clock controller 60. The physical structure of the fifth plausible clock controller 58 and the siwth plausible clock controller 60 is shown as FIG. 5(*b*).

Figure 14A:
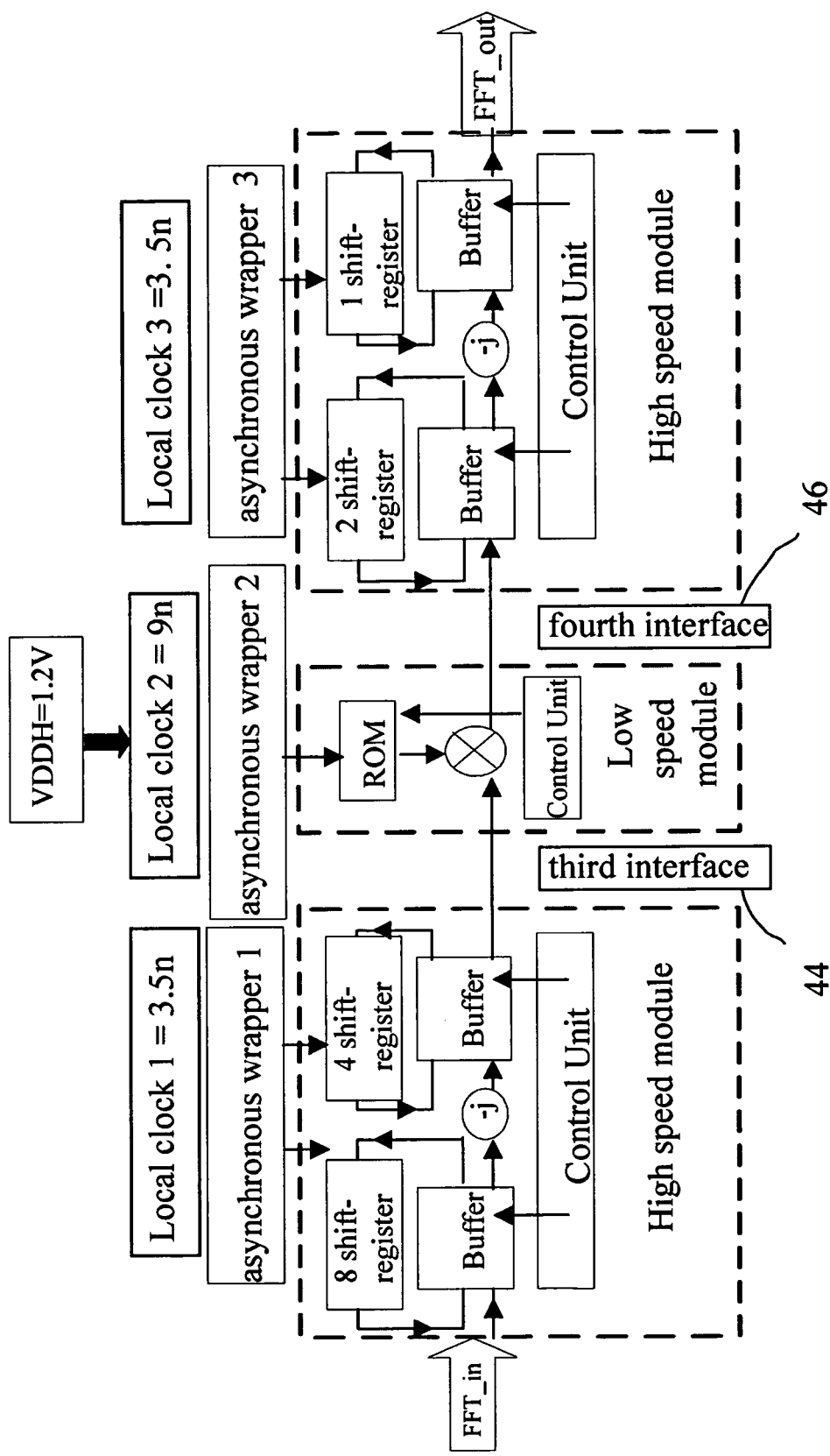
FIG. 14(a) is a diagram schematically showing a GALS-based single-supply-voltage FFT architecture according to the present invention.
Figure 14B:
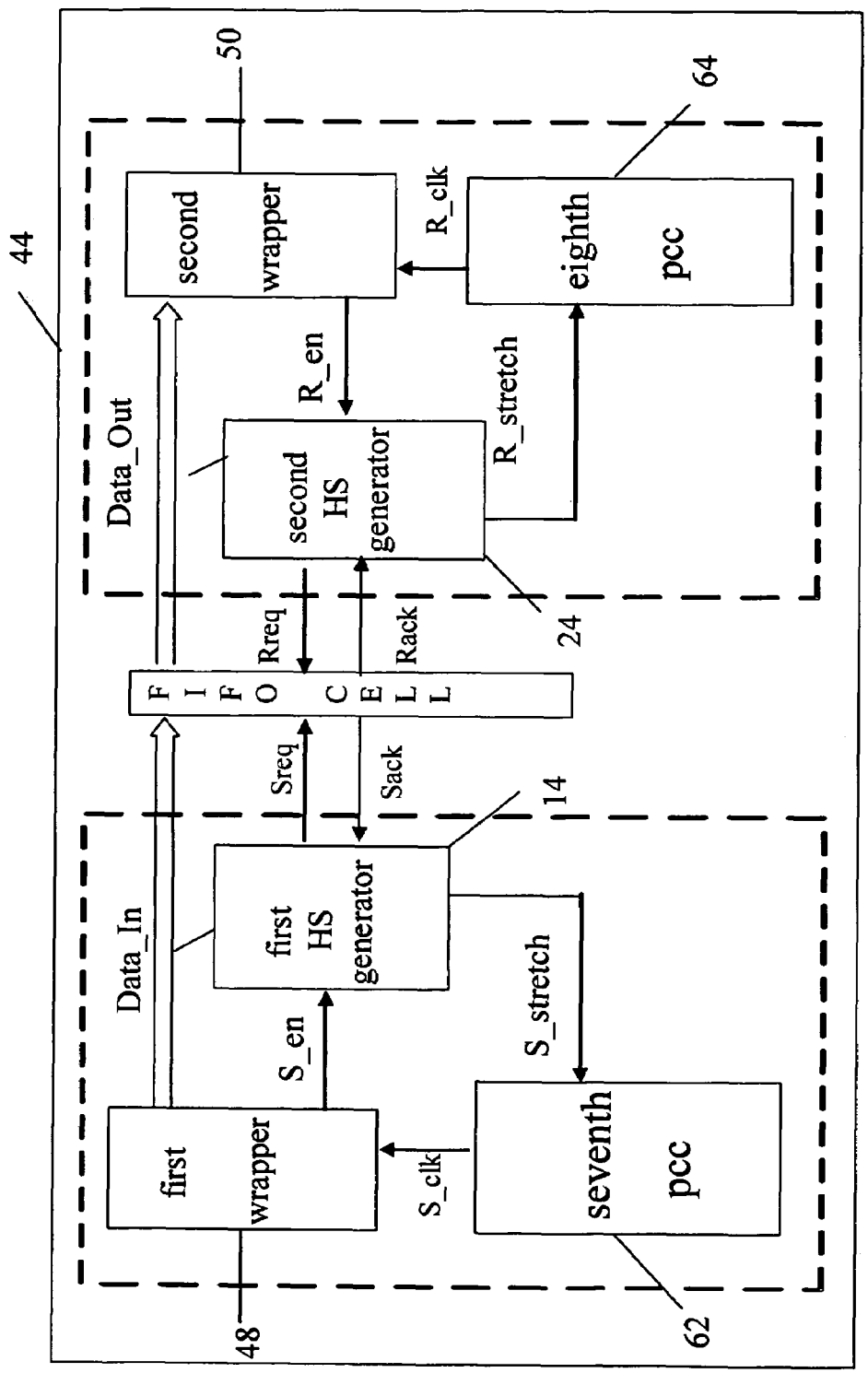
FIG. 14(b) is a diagram schematically showing a third interface of a GALS-based single-supply-voltage FFT architecture according to the present invention.
Figure 14C:
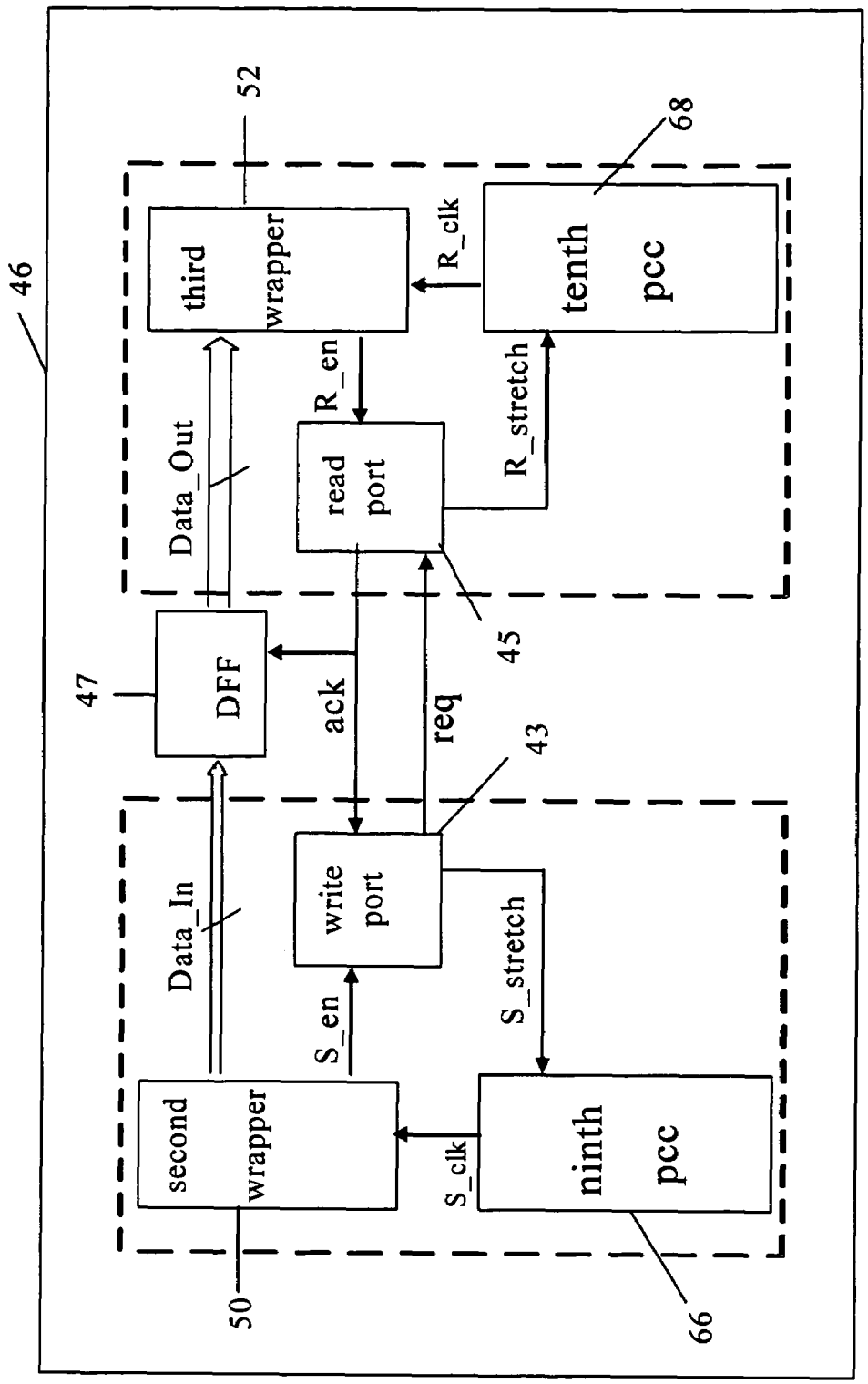
FIG. 14(c) is a diagram schematically showing a third interface of a GALS-based single-supply-voltage FFT architecture according to the present invention.
Figure 15:
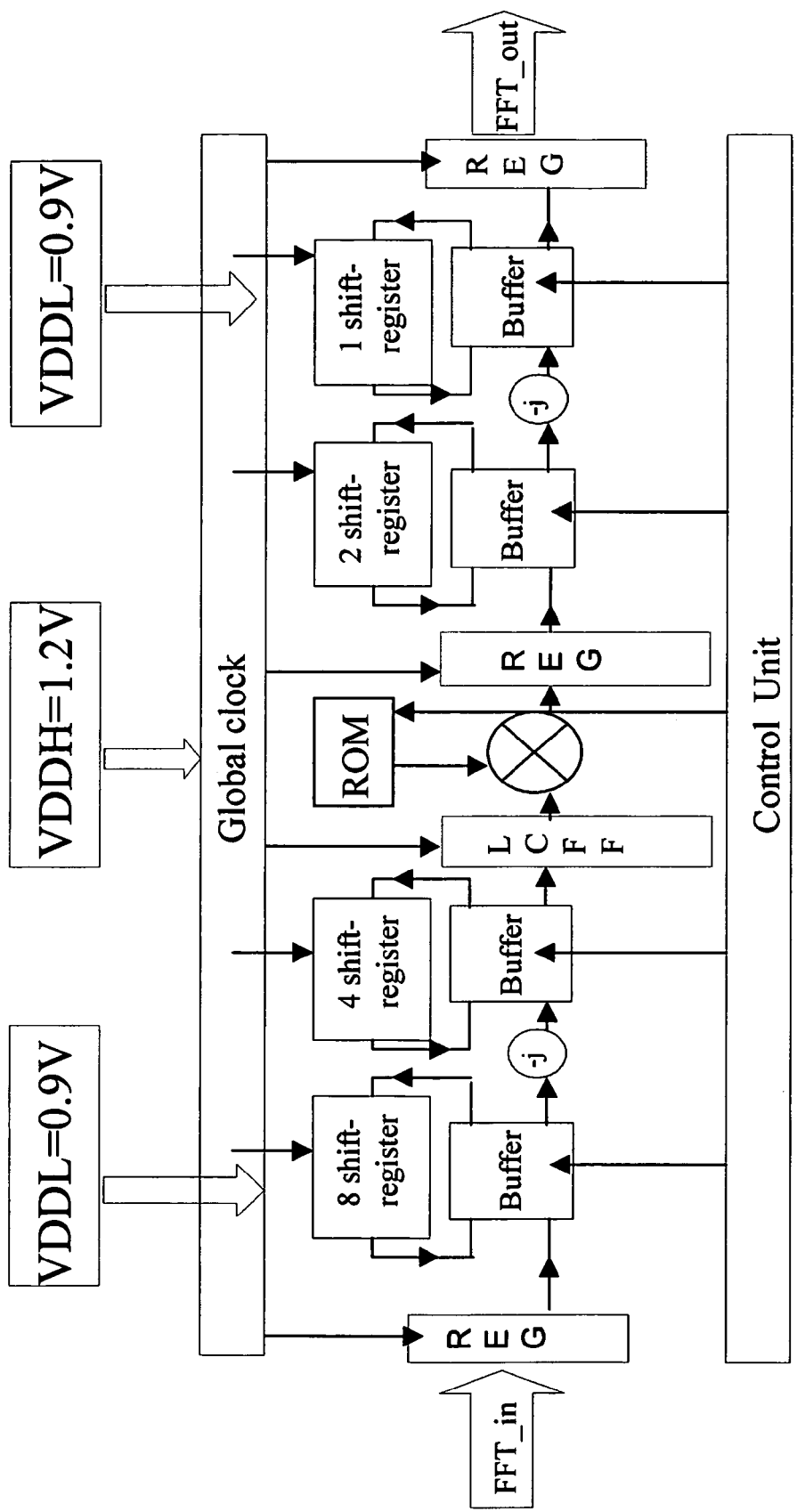
FIG. 15 is a diagram schematically showing a synchronous dual-supply-voltage FFT architecture according to the present invention.
Figure 16:
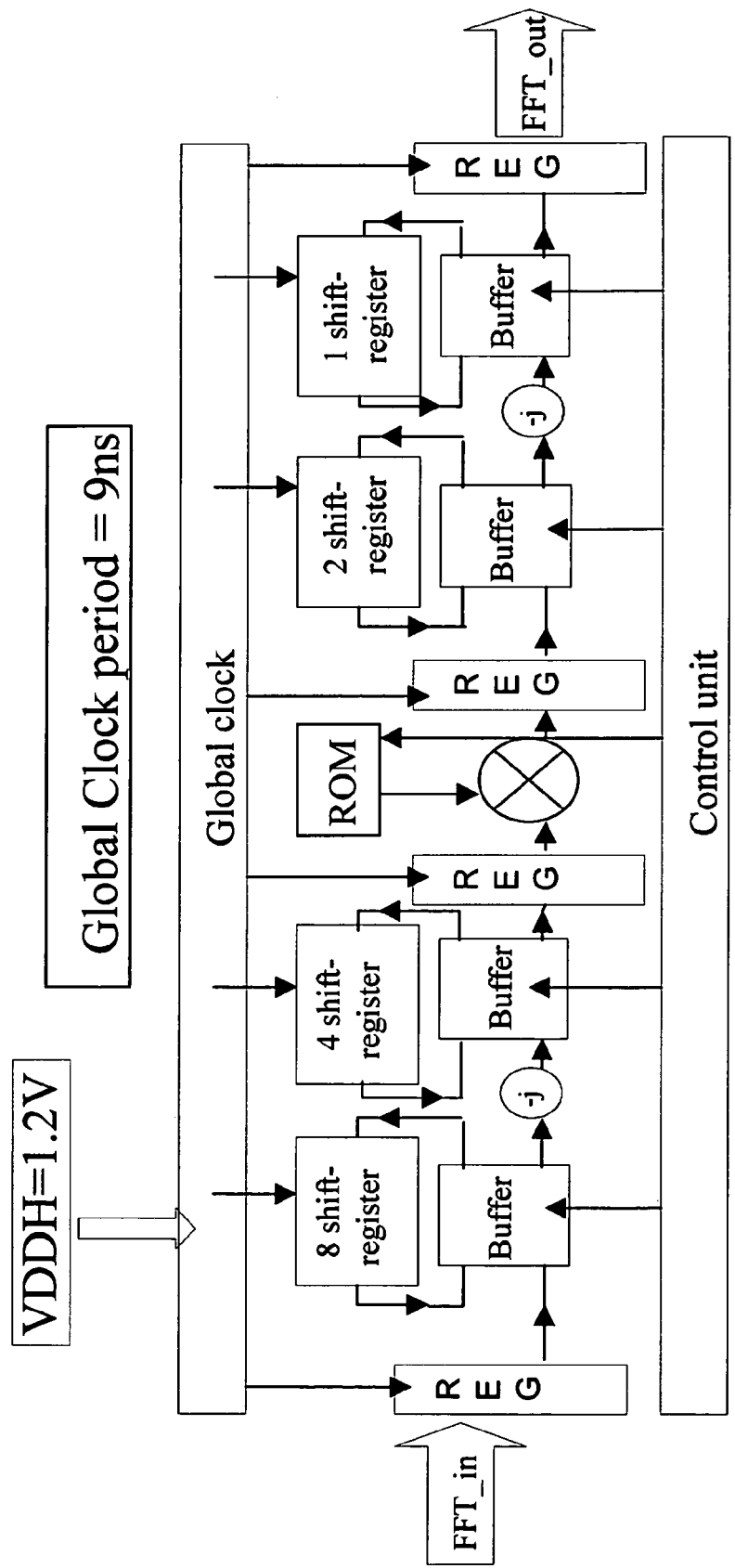
FIG. 16 is a diagram schematically showing a synchronous single-supply-voltage FFT architecture according to the present invention.

The dual-supply-voltage GALS-based FFT architecture shown in FIG. 11(*a*), the single-supply-voltage GALS-based FFT architecture shown in FIG. 14(*a*), the dual-supply-voltage synchronous FFT architecture shown in FIG. 15 and the single-supply-voltage synchronous FFT architecture shown in FIG. 16 are to be compared via the simulation implemented by TSMC 0.13 μm process.

TABLE 1

|  | First wrapper | Second wrapper | Third wrapper |
|---|---|---|---|
| Single-supply-voltage synchronous system |  | Clock = 9 ns<br>VDDH = 1.2 V |  |
| Dual-supply-voltage synchronous system | VDDL = 0.9 V | Clock = 9 ns<br>VDDH = 1.2 V | VDDL = 0.9 V |
| Single-supply-voltage GALS-based system | Clock = 3.5 ns | Clock = 9 ns<br>VDDH = 1.2 V | Clock = 3.5 ns |
| Dual-supply-voltage GALS-based system | Clock = 5 ns<br>VDDL = 0.9 V | Clock = 9 ns<br>VDDH = 1.2 V | Clock = 5 ns<br>VDDL = 0.9 V |

Figure 17:
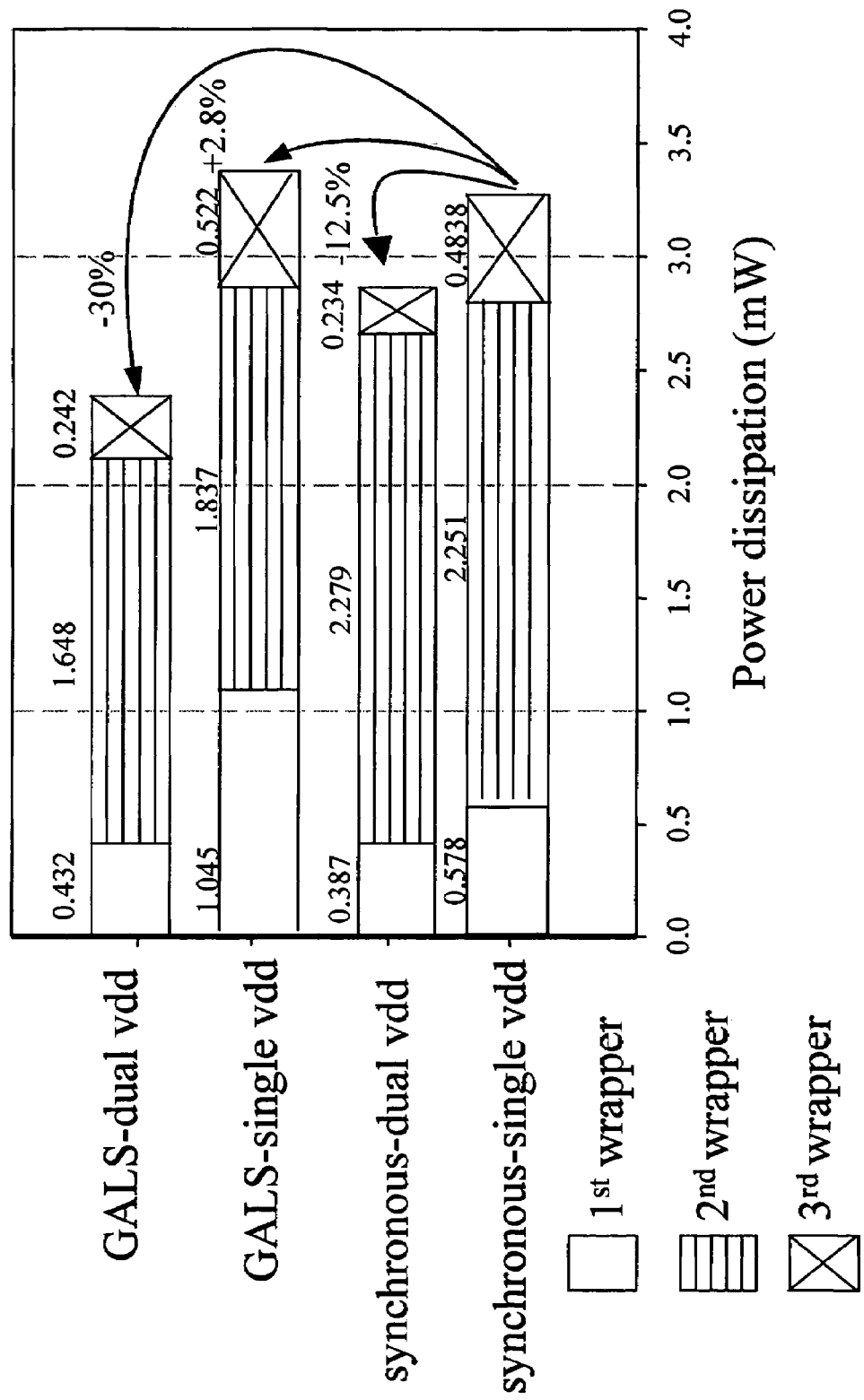
FIG. 17 is a diagram showing the result of the power consumption comparison of those four kinds of FFT architectures according to the present invention.

Refer to Table. 1 and FIG. 17 for the power consumption comparison of those four kinds of FFT architectures, and it can be found that the dual-supply-voltage systems consume less power than the single-supply-voltage systems. In the synchronous FFT architectures, the dual-supply-voltage system outperforms the single-supply-voltage system by 12.5% power saving. The power consumptions of the first wrappers and the third wrappers of the GALS-based FFT architectures (shown in from FIG. 11(*a*) to FIG. 11(*c*) and from FIG. 14(*a*) to FIG. 14(*c*)) are greater than the power consumptions of the first wrapper and the third wrapper of one of the synchronous FFT architectures because the operational frequencies of the GALS-based FFT architectures are higher and the interface circuits thereof are more complicated. The power consumptions of the second wrappers of the GALS-based FFT architectures are much less than the power consumptions of the second wrappers of the synchronous FFT architectures because there is no power consumed in the clock switching operation for the ROM and multiplexer when the first wrapper is not ready to send out data and the second wrapper is waiting for the transference of the data. From FIG. 17, it is also can be seen that the GALS-based FFT architectures do not outperform one of the synchronous FFT architectures in the overall power consumption; the reason may be that the GALS-based FFT architectures have more complicated interface circuit and the power consumed by the complicated interface circuit is greater that the power saved at the period that no clock switching operation is undertaken.

Figure 18:
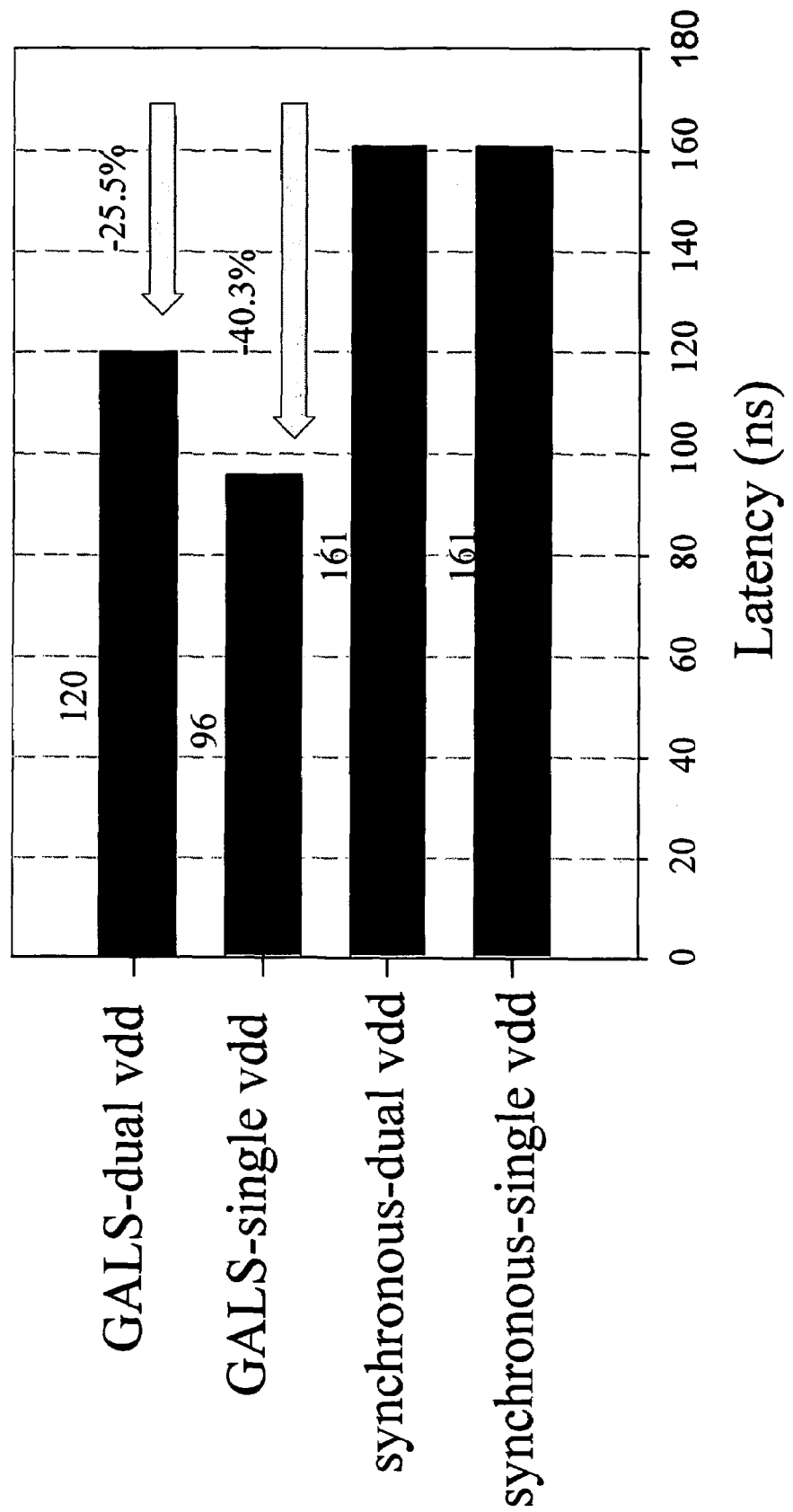
FIG. 18 is a diagram showing the result of the latency comparison of those four kinds of FFT architectures according to the present invention.

Refer to FIG. 18 for the latency comparison of those four kinds of FFT architectures, and it can be found that the GALS-based FFT architectures have shorter latencies. The reason is that the clocks of the first wrappers of the GALS-based FFT architectures are faster than the clocks of the synchronous FFT architectures. Therefore, the dual-supply-voltage 16-point radix-$2^2$ GALS-based single-path delay feedback FFT architecture can have shorter latency and save more power.

Those embodiments described above are to clarify the technical thoughts and characteristics of the present invention in order to enable the persons skilled in the art to understand, make and use the present invention; however, it is not intended to limit the scope of the present invention, and any equivalent modification and variation according to the spirit of the present invention disclosed herein is still to be included within the scope of the present invention.

What is claimed is:

1. A single-supply-voltage asynchronous first-in-first-out cell, positioned between a first asynchronous wrapper and a second asynchronous wrapper, and comprising:
   a data latch, further comprising a register, and responsible for inputting and outputting data;
   a full/empty detector, detecting the data access state of said data latch;
   a sender's handshake controller, coupled to said data latch and said full/empty detector, learning from said full/empty detector that the storage space of said data latch is not full yet, receiving a sender's token signal, creating a sender's acknowledge signal and sending it to said first asynchronous wrapper; and
   a receiver's handshake controller, coupled to said data latch and said full/empty detector, learning from said full/empty detector that there is data stored in said data latch, receiving a receiver's token signal, creating a receiver's acknowledge signal and sending it to said second asynchronous wrapper.

2. The single-supply-voltage asynchronous first-in-first-out cell according to claim 1, wherein the data cannot be stored into said data latch unless said sender's handshake controller has received said sender's token; if said data latch has no storage space for said data, said sender's acknowledge signal is not sent to said first asynchronous wrapper until said data latch has storage space.

3. The single-supply-voltage asynchronous first-in-first-out cell according to claim 1, wherein the data stored in said data latch cannot be output unless said receiver's handshake controller has received said receiver's token; if the data stored in said data latch has been output, said receiver's acknowledge signal is not sent to said second asynchronous wrapper until there is data stored in said data latch.

4. The single-supply-voltage asynchronous first-in-first-out cell according to claim 1, wherein said first asynchronous wrapper further comprises:
   a first locally-synchronous module, creating a first enable signal when said first locally-synchronous module is ready to store data into said data latch;
   a first handshake generator, receiving said first enable signal, creating a sender's request signal and send it to said sender's handshake controller, creating a first stretch signal, and receiving said sender's acknowledge signal from said sender's handshake controller; and
   a first plausible clock controller, receiving and processing said first stretch signal, creating a first local clock signal and sending it to said first locally-synchronous module, which then sends data to said data latch.

5. The single-supply-voltage asynchronous first-in-first-out cell according to claim 1, wherein said second asynchronous wrapper further comprises:
   a second locally-synchronous module, creating a second enable signal when said second locally-synchronous module is ready to output the data temporarily stored in said data latch;
   a second handshake generator, receiving said second enable signal, creating a receiver's request signal and send it to said receiver's handshake controller, creating a second stretch signal, and receiving said receiver's acknowledge signal from said receiver's handshake controller; and a second plausible clock controller, receiving and processing said second stretch signal, creating a second local clock signal and sending it to said second locally-synchronous module, which then receives the data stored in said data latch.

6. The single-supply-voltage asynchronous first-in-first-out cell according to claim 4, wherein said first plausible clock controller can stop or prolong said first stretch signal lest the time that said first stretch signal arrives at said first plausible clock controller be too close to the time that data is processed to transfer to said data latch.

7. The single-supply-voltage asynchronous first-in-first-out cell according to claim 5, wherein said second plausible clock controller can stop or prolong said second stretch signal lest the time that said second stretch signal arrives at said second plausible clock controller be too close to the time that the data stored in said data latch is processed to output.

8. The single-supply-voltage asynchronous first-in-first-out cell according to claim 1, wherein said full/empty detector further comprises:
   a first CMOS, receiving said sender's acknowledge signal with the P-type transistor of said first CMOS externally coupled to an inverter;
   a second CMOS, receiving said receiver's acknowledge signal, and positioned between the P-type and N-type transistors of said first CMOS;
   an N-type transistor, coupled to between the P-type and N-type transistors of said second CMOS, and functioning as the input terminal of a reset signal when said full/empty detector detects that there is data stored in said data latch; and
   a first output terminal, externally coupled to an inverter, positioned between the P-type and N-type transistors of said second CMOS, and functioning as the output terminal of the signals of said full/empty detector.

9. The single-supply-voltage asynchronous first-in-first-out cell according to claim 4, wherein said sender's handshake controller further comprises:
   a third CMOS, receiving said receiver's acknowledge signal, with the N-type transistor thereof externally coupled to an inverter;
   a fourth CMOS, receiving the inversion signal of said sender's acknowledge signal, and positioned between the P-type and N-type transistors of said third CMOS;
   a fifth CMOS, receiving said sender's request signal, positioned between the P-type and N-type transistors of said fourth CMOS;
   a first P-type transistor, coupled to between the P-type and N-type transistors of said fifth CMOS, and functioning as the input terminal of an inversion signal when said full/empty detector detects that there is data stored in said data latch; and
   a second output terminal, externally coupled to an inverter, positioned between the P-type and N-type transistors of said fifth CMOS, and functioning as the output terminal of the signals of said sender's handshake controller.

10. The single-supply-voltage asynchronous first-in-first-out cell according to claim 5, wherein said receiver's handshake controller further comprises:
   a sixth CMOS, receiving the inversion signal of said receiver's acknowledge signal;
   a seventh CMOS, receiving said receiver's request signal, and positioned between the P-type and N-type transistors of said sixth CMOS;
   a second P-type transistor, coupled to between the P-type and N-type transistors of said seventh CMOS, and functioning as the input terminal of an inversion signal when said full/empty detector detects that there is no data stored in said data latch; and
   a third output terminal, externally coupled to an inverter, positioned between the P-type and N-type transistors of said seventh CMOS, and functioning as the output terminal of the signals of said receiver's handshake controller.

11. The single-supply-voltage asynchronous first-in-first-out cell according to claim 9, wherein one control signal of said sender's handshake controller is a signal output by said receiver's handshake controller lest there should be a data transparent problem from the input data to the output data.

12. A dual-supply-voltage asynchronous first-in-first-out cell, positioned between a first asynchronous wrapper and a second asynchronous wrapper, wherein said first asynchronous wrapper is externally coupled to a first supply voltage, and said second asynchronous wrapper is externally coupled to a second supply voltage, and said second supply voltage is greater than said first supply voltage, and comprising:
   a data latch, responsible for data input/output, and further comprising a level converter flip-flop, which has flip-flop and level conversion functions;
   a full/empty detector, used to detect the data access state of said data latch;
   a sender's handshake controller, coupled to said data latch and said full/empty detector, learning from said full/empty detector that the storage space of said data latch is not full yet, receiving a sender's token signal, creating a sender's acknowledge signal and sending it to said first asynchronous wrapper;
   a receiver's handshake controller, coupled to said data latch and said full/empty detector, learning from said full/empty detector that there is data stored in said data latch, receiving a receiver's token signal, creating a receiver's acknowledge signal and sending it to said second asynchronous wrapper; and
   an asynchronous level converter, coupled to said receiver's handshake controller and said full/empty detector, and converting said first supply voltage into said second supply voltage.

13. The dual-supply-voltage asynchronous first-in-first-out cell according to claim 12, wherein the data cannot be stored into said data latch unless said sender's handshake controller has received said sender's token; if said data latch has no storage space for said data, said sender's acknowledge signal is not sent to said first asynchronous wrapper until said data latch has storage space.

14. The dual-supply-voltage asynchronous first-in-first-out cell according to claim 12, wherein the data stored in said data latch cannot be output unless said receiver's handshake controller has received said receiver's token; if the data stored in said data latch has been output, said receiver's acknowledge signal is not sent to said second asynchronous wrapper until there is data stored in said data latch.

15. The dual-supply-voltage asynchronous first-in-first-out cell according to claim 12, wherein said first asynchronous wrapper further comprises:
   a first locally-synchronous module, creating a first enable signal when said first locally-synchronous module is ready to store data into said data latch;

a first handshake generator, receiving said first enable signal, creating a sender's request signal and send it to said sender's handshake controller, creating a first stretch signal, and receiving said sender's acknowledge signal from said sender's handshake controller; and a first plausible clock controller, receiving and processing said first stretch signal, creating a first local clock signal and sending it to said first locally-synchronous module, which then sends data to said data latch.

16. The dual-supply-voltage asynchronous first-in-first-out cell according to claim 12, wherein said second asynchronous wrapper further comprises:

a second locally-synchronous module, creating a second enable signal when said second locally-synchronous module is ready to output the data temporarily stored in said data latch;

a second handshake generator, receiving said second enable signal, creating a receiver's request signal and send it to said receiver's handshake controller, creating a second stretch signal, and receiving said receiver's acknowledge signal from said receiver's handshake controller; and a second plausible clock controller, receiving and processing said second stretch signal, creating a second local clock signal and sending it to said second locally-synchronous module, which then receives the data stored in said data latch.

17. The dual-supply-voltage asynchronous first-in-first-out cell according to claim 15, wherein said first plausible clock controller can stop or prolong said first stretch signal lest the time that said first stretch signal arrives at said first plausible clock controller be too close to the time that data is processed to transfer to said data latch.

18. The dual-supply-voltage asynchronous first-in-first-out cell according to claim 16, wherein said second plausible clock controller can stop or prolong said second stretch signal lest the time that said second stretch signal arrives at said second plausible clock controller be too close to the time that the data stored in said data latch is processed to output.

19. The dual-supply-voltage asynchronous first-in-first-out cell according to claim 12, wherein said full/empty detector further comprises:

a first CMOS, receiving said sender's acknowledge signal with the P-type transistor of said first CMOS externally coupled to an inverter;

a second CMOS, receiving said receiver's acknowledge signal, and positioned between the P-type and N-type transistors of said first CMOS;

an N-type transistor, coupled to between the P-type and N-type transistors of said second CMOS, and functioning as the input terminal of a reset signal when said full/empty detector detects that there is data stored in said data latch; and a first output terminal, externally coupled to an inverter, positioned at said second CMOS, and functioning as the output terminal of the signals of said full/empty detector.

20. The dual-supply-voltage asynchronous first-in-first-out cell according to claim 15, wherein said sender's handshake controller further comprises:

a third CMOS, receiving said receiver's acknowledge signal, with the N-type transistor thereof externally coupled to an inverter;

a fourth CMOS, receiving the inversion signal of said sender's acknowledge signal, and positioned between the P-type and N-type transistors of said third CMOS;

a fifth CMOS, receiving said sender's request signal, positioned between the P-type and N-type transistors of said fourth CMOS;

a first P-type transistor, coupled to between the P-type and N-type transistors of said fifth CMOS, and functioning as the input terminal of an inversion signal when said full/empty detector detects that there is data stored in said data latch; and a second output terminal, externally coupled to an inverter, positioned between the P-type and N-type transistors of said fifth CMOS, and functioning as the output terminal of the signals of said sender's handshake controller.

21. The dual-supply-voltage asynchronous first-in-first-out cell according to claim 16, wherein said receiver's handshake controller further comprises:

a sixth CMOS, receiving the inversion signal of said receiver's request signal;

a seventh CMOS, receiving said receiver's request signal, and positioned between the P-type and N-type transistors of said sixth CMOS;

a second P-type transistor, coupled to between the P-type and N-type transistors of said seventh CMOS, and functioning as the input terminal of an inversion signal when said full/empty detector detects that there is no data stored in said data latch; and a third output terminal, externally coupled to an inverter, positioned between the P-type and N-type transistors of said seventh CMOS, and functioning as the output terminal of the signals of said receiver's handshake controller.

22. The dual-supply-voltage asynchronous first-in-first-out cell according to claim 20, wherein one control signal of said sender's handshake controller is a signal output by said receiver's handshake controller, which can prevent the data transparent problem occurring from the input data to the output data.

23. The dual-supply-voltage asynchronous first-in-first-out cell according to claim 12, wherein said level converter flip-flop adopts a pulsed flip-flop, and when said level converter flip-flop samples said sender's acknowledge signals, it is equivalent to a pulse.

24. The dual-supply-voltage asynchronous first-in-first-out cell according to claim 12, wherein said asynchronous level converter can avoid extra power consumption when P-type transistors are not totally turned off.

* * * * *